United States Patent [19]
Taguchi et al.

[11] Patent Number: 5,641,976
[45] Date of Patent: Jun. 24, 1997

[54] PRESSURE CONTACT TYPE SEMICONDUCTOR DEVICE WITH AXIAL BIAS AND RADIAL RESTRAINT BETWEEN A DISTORTION BUFFER PLATE AND A SEMICONDUCTOR BODY

[75] Inventors: Kazunori Taguchi; Kyoutaro Hirasawa; Yuzuru Konishi, all of Fukuoka, Japan

[73] Assignee: Mitsubishi Denki Kabushiki Kaisha, Tokyo, Japan

[21] Appl. No.: 388,434

[22] Filed: Feb. 14, 1995

[30] Foreign Application Priority Data

Feb. 23, 1994 [JP] Japan .................................. 6-025421

[51] Int. Cl.[6] .............................. H01L 23/42; H01L 23/44
[52] U.S. Cl. ...................... 257/178; 257/181; 257/182; 257/688; 257/719; 257/727; 257/785
[58] Field of Search ................................. 257/178, 181, 257/182, 688, 785, 727, 719

[56] References Cited

U.S. PATENT DOCUMENTS

| | | | |
|---|---|---|---|
| 4,956,696 | 9/1990 | Hoppe et al. | |
| 5,047,836 | 9/1991 | Tokunoh | 257/785 |
| 5,121,189 | 6/1992 | Niwayama | 257/181 |
| 5,371,386 | 12/1994 | Tokunoh et al. | 257/181 |
| 5,489,802 | 2/1996 | Sakamoto et al. | 257/688 |

FOREIGN PATENT DOCUMENTS

| | | | |
|---|---|---|---|
| 0158749 | 10/1985 | European Pat. Off. | |
| 0365007 | 4/1990 | European Pat. Off. | |
| 0150635 | 8/1985 | Japan | 257/181 |
| 61-30257 | 2/1986 | Japan | |
| 61-30258 | 2/1986 | Japan | |
| 62-173741 | 7/1987 | Japan | |
| 0289940 | 11/1988 | Japan | 257/688 |
| 0126676 | 5/1990 | Japan | 257/623 |

OTHER PUBLICATIONS

IBM Technical Disclosure Bulletin, vol. 36, No. 10, pp. 289–290, Oct. 1993, "Flip Chip Burn–In Socket".

*Primary Examiner*—Sara W. Crane
*Assistant Examiner*—David B. Hardy
*Attorney, Agent, or Firm*—Oblon, Spivak, McClelland, Maier & Neustadt, P.C.

[57] ABSTRACT

An alloy-free pressure contact type semiconductor device maintains a high reliability during transportation even without a pressure contact tool such as a simplified stack and therefore does not require a high transportation cost. Through holes (H1) and (H2) each having a circular cross section are formed in distortion buffer plates (21A) and (21K) at the center. A first and a second bottomed holes (i.e., recesses) (N1) and (N2) are formed in an anode electrode plate (41A) and a cathode electrode plate (41K). From the through hole (H1) up to the first bottomed hole (N1), a pressure contact pin (9) biased by a coil spring (8) is disposed. From the through hole (H2) down to the second bottomed hole (N2), a fixing pin (90) is disposed. Without applying external pressure upon the device, it is possible to prevent displacement of the first and the second distortion buffer plates due to vibration or impact during transportation and damage to a semiconductor body. Therefore, a transportation cost is low and the reliability of the device is high.

11 Claims, 15 Drawing Sheets

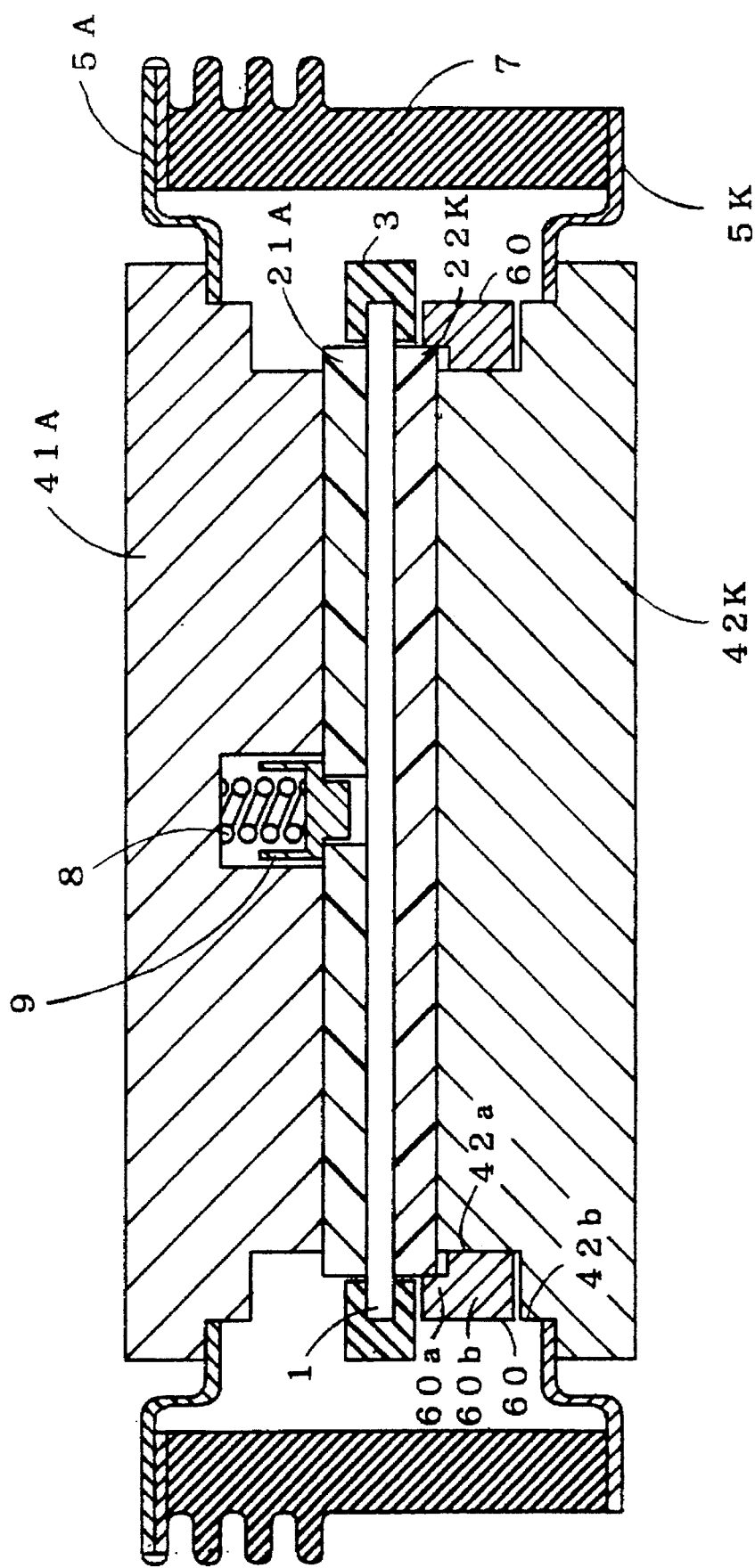

5,641,976

PRESSURE CONTACT TYPE SEMICONDUCTOR DEVICE WITH AXIAL BIAS AND RADIAL RESTRAINT BETWEEN A DISTORTION BUFFER PLATE AND A SEMICONDUCTOR BODY

BACKGROUND OF THE INVENTION

1. Field of the Invention

The present invention relates to a pressure contact type semiconductor device, and particularly, to such a semiconductor device in which a distortion buffer plate and a semiconductor body are in an alloy-free contact to each other.

2. Description of the Background Art

Among power pressure contact type semiconductor devices (i.e., pressure contact power devices), those in which a semiconductor body is disposed without brazing (alloy-free) are known as alloy-free pressure contact type semiconductor devices. Where a distortion buffer plate and a semiconductor body are adjoined to each other using a brazing material such as a solder and aluminum, large thermal stress will be created due to a difference in expansion coefficients. To avoid this, in an alloy-free pressure contact type semiconductor device, a semiconductor body is sandwiched by electrodes from the top and the bottom through distortion buffer plates made of molybdenum or the like. Due to this structure, in this type of semiconductor device, electric connection is realized only by a pressure contact during use of the semiconductor device.

FIG. 14 is a cross-sectional view of a conventional power diode which is structured as an alloy-free pressure contact type semiconductor device. In the pressure contact type semiconductor device of FIG. 14, a first and a second disk-shaped distortion buffer plates 2A and 2K are disposed on a top and a bottom major surfaces of a semiconductor body 1, respectively. The distortion buffer plates 2A and 2K are in an alloy-free contact to an anode electrode layer and a cathode electrode layer (both not shown) which are formed in the top and the bottom major surfaces, respectively, of a semiconductor substrate which forms the semiconductor body 1.

A protector 3 is fixed to a periphery of the semiconductor body 1 to prevent electric discharge from the periphery of the semiconductor body 1 and to protect the periphery of the semiconductor body 1.

A disk-shaped anode electrode plate 4A and a disk-shaped cathode electrode plate 4K are disposed on the distortion buffer plates 2A and 2K, respectively, in an alloy-free contact.

This stacked structure is housed in a cylindrical ceramic casing 7. Through a metallic anode flange 5A and a metallic cathode flange 5K, respectively, the base portions of the anode electrode plate 4A and the cathode electrode plate 4K are linked to the casing 7.

During use of such a pressure contact type semiconductor device in a predetermined apparatus, the anode flange 5A and the cathode flange 5K are subjected to external force F of the direction indicated by the arrows in FIG. 14 so as to be pressed respectively through the distortion buffer plates 2A and 2K and to be securely electrically connected to the top and the bottom major surfaces of the semiconductor body 1.

In general, the cathode flange 5K is brazed to the casing 7 while the anode flange 5A is welded or cold-welded to a flange 5F which is attached to the casing 7 in advance. The cathode flange 5K and the anode flange 5A not only seal the casing 7 airtight but also function as springs.

The reason of using the cathode flange 5K and the anode flange 5A as springs as well is to absorb thermal stress which is created when the anode flange 5A and the cathode flange 5K are brazed or welded to the casing 7 due to a difference in expansion coefficients, and to absorb a tensile stress which is created at joints of the casing 7 and the anode flange 5A and the cathode flange 5K when the structural members contained in the casing 7 have different thicknesses and the overall height of the assembled structure is different from what is originally expected.

Briefly summarizing, the cathode flange 5K and the anode flange 5A must have a sufficient spring strength so that:

a) thermal stress due to a difference in the expansion coefficients is absorbed during fixing of the flanges;

b) the overall spring strength of the flanges does not have a resonance point against external vibration; and c) tensile stress is absorbed which is created at the flange joints due to the different thicknesses of the structural members contained in the casing 7.

The spring strength which satisfies the conditions above is not as large as the external force F which is applied to the anode flange 5A and the cathode flange 5K during pressing. Under no pressure (i.e., in which the external force F is not applied), the distortion buffer plates 2A and 2K and the semiconductor body 1 sandwiched by the anode flange 5A and the cathode flange 5K are not constrained completely.

If the pressure contact type semiconductor device in such an under-no-pressure condition is heated, for example, left for six hours at 150° C. for the purpose of aging, since the casing 7 is sealed airtight, pressure mounts within the casing 7. Eventually, the anode electrode plate 4A and the cathode electrode plate 4K are pushed upward from the flange joints, cracking gaps between the structural members which are contained in the casing 7.

If the structural members contained in the casing 7 have different thicknesses, gaps exist between some structural members even when the device is placed at a normal temperature.

In the conventional pressure contact type semiconductor device having such a structure, if gaps are created between the semiconductor body 1 and the distortion buffer plates 2A and 2K, external vibration during assembling or transportation allows the semiconductor body 1 and the distortion buffer plates 2A and 2K to vibrate independently of each other. Because of this, the semiconductor body 1 is subjected to an offset load of an axial direction of the semiconductor body 1.

The gaps also reduce friction between the semiconductor body 1 and the distortion buffer plates 2A and 2K at the respective contact surfaces. This permits the distortion buffer plates 2A and 2K to vibrate in a radial direction as well. As a result, the protector 3 falls off from the periphery of the semiconductor substrate. Other possibility is that the offset load acting upon the semiconductor body 1 through the protector 3 cracks the semiconductor substrate of the semiconductor body 1, which degrades the reliability of the semiconductor device.

To fix the components which are housed in the casing 7 and to thereby prevent gaps created between the components, the conventional pressure contact type semiconductor device needs be transported while externally pressed using a pressure contact tool such as a simplified stack. Thus, the conventional pressure contact type semiconductor device is not convenient for transportation and is costly.

SUMMARY OF THE INVENTION

In a first aspect of the present invention, a pressure contact type semiconductor device comprises a stacked structure which is formed by stacking a first distortion buffer plate and a first electrode plate on a first major surface of a semiconductor body which has at least one PN junction and stacking a second distortion buffer plate and a second electrode plate on a second major surface of the semiconductor body, the semiconductor device being used with the first and the second distortion buffer plates in an alloy-free contact with the semiconductor body and with the first and the second electrode plates pressed against the semiconductor body. The semiconductor device comprises: first restraint means inserted between the first electrode plate and the first distortion buffer plate, the first restraint means biasing the first distortion buffer plate against the first major surface of the semiconductor body and restricting a relative positional relation between the first electrode plate and the first distortion buffer plate in a direction which is parallel with the first major surface of the semiconductor body; and second restraint means inserted between the second electrode plate and the second distortion buffer plate, the second restraint means restricting a relative positional relation between the second electrode plate and the second distortion buffer plate in a direction which is parallel with the second major surface of the semiconductor body.

According to a second aspect of the present invention, in the pressure contact type semiconductor device of the first aspect of the present invention, a first recess is formed in the first electrode plate at a portion which faces the semiconductor body, a first hole is formed in the first distortion buffer plate at a portion which faces the first recess, and the first restraint means includes: an elastic member which is contained in the first recess; and a first pin inserted in the first recess to be biased by the elastic member against the first major surface of the semiconductor body.

According to a third aspect of the present invention, in the pressure contact type semiconductor device of the second aspect of the present invention, the first hole is a through hole which has a smaller opening than the first recess, and the first pin includes: a base portion having a larger diameter than the diameter of the first hole, the base portion being contained in the first recess; and a protrusion contained in the first recess to extend from the base portion, the protrusion being shorter than the thickness of the first distortion buffer plate.

According to a fourth aspect of the present invention, in the pressure contact type semiconductor device of the second aspect of the present invention, the first hole is a hole with a bottom.

According to a fifth aspect of the present invention, in the pressure contact type semiconductor device of the first aspect of the present invention, the first restraint means is spatially separated into biasing means and restricting means, the biasing means biasing the first distortion buffer plate against the first major surface of the semiconductor body, the restricting means restricting the relative positional relation between the first electrode plate and the first distortion buffer plate in the direction which is parallel with the first major surface of the semiconductor body, and the restricting means includes a first elastic element which is inserted at a border between a periphery of the first electrode plate and a periphery of the first distortion buffer plate.

According to a sixth aspect of the present invention, in the pressure contact type semiconductor device of the fifth aspect of the present invention, a first recess is formed in the first electrode plate at a portion which faces the semiconductor body, a first hole is formed in the first distortion buffer plate at a portion which faces the first recess, and the restricting means includes a first pin which is inserted to extend from the first recess to the first hole.

According to a seventh aspect of the present invention, in the pressure contact type semiconductor device of the fifth aspect of the present invention, a first recess is formed in the first electrode plate at a portion which faces the semiconductor body, a first hole is formed in the first distortion buffer plate at a portion which faces the first recess, and the restricting means includes: a second elastic element contained in the first recess; and an electrode member extending from the first recess to the through hole, the electrode member contacting the first major surface of the semiconductor body, the electrode member being biased by the second elastic element against the first major surface.

According to an eighth aspect of the present invention, in the pressure contact type semiconductor device of the sixth aspect of the present invention, a second recess is formed in the second electrode plate at a portion which faces the semiconductor body, a second hole is formed in the second distortion buffer plate at a portion which faces the second recess, and the second restraint means includes: a third elastic element contained in the second recess; and an electrode member extending from the second recess to the through hole, the electrode member contacting the second major surface of the semiconductor body, the electrode member being biased by the third elastic element against the second major surface.

According to a ninth aspect of the present invention, in the pressure contact type semiconductor device of the seventh aspect of the present invention, a second recess is formed in the second electrode plate at a portion which faces the semiconductor body, a second hole is formed in the second distortion buffer plate at a portion which faces the second recess, and the second restraint means includes a second pin which is contained to extend from the second recess to the second hole.

According to a tenth aspect of the present invention, in the pressure contact type semiconductor device of the seventh aspect of the present invention, the second restraint means includes a ring member which is engaged with peripheries of the second electrode plate and the second distortion buffer plate.

According to an eleventh aspect of the present invention, a pressure contact type semiconductor device comprises a stacked structure which is formed by stacking a first distortion buffer plate and a first electrode plate on a first major surface of a semiconductor body which has at least one PN junction and stacking a second distortion buffer plate and a second electrode plate on a second major surface of the semiconductor body, the semiconductor device being used with the first and the second distortion buffer plates in an alloy-free contact with the semiconductor body and with the first and the second electrode plates pressed against the semiconductor body. The semiconductor device comprises: an insulation casing for housing the stacked structure, the casing being linked to the first and the second electrode plates; and restraint means inserted between the first electrode plate and the first distortion buffer plate, the restraint means biasing the first distortion buffer plate against the first major surface of the semiconductor body and restricting a relative positional relation between the first electrode plate and the first distortion buffer plate in a direction which is parallel with the first major surface of the semiconductor body, wherein the second electrode plate is engaged with the second distortion buffer plate.

Preferably, a recess is formed in the first electrode plate at a portion which faces the semiconductor body, a hole is formed in the first distortion buffer plate at a portion which faces the recess, and the restraint means includes: an elastic member contained in the recess; and a pin contained in the recess to be biased by the elastic member against the first major surface of the semiconductor body.

Alternatively, the hole is a through hole which has a smaller opening than the recess, and the pin includes: a base portion having a larger diameter than the diameter of the hole, the base portion being contained in the recess; and a protrusion contained in the recess to extend from the base portion, the protrusion being shorter than the thickness of the first distortion buffer plate.

Alternatively, the hole is a hole with a bottom.

Alternatively, the restraint means is spatially separated into biasing means and restricting means, the biasing means biasing the first distortion buffer plate against the first major surface of the semiconductor body, the restricting means restricting the relative positional relation between the first electrode plate and the first distortion buffer plate in the direction which is parallel with the first major surface of the semiconductor body, and the restricting means includes a first elastic element which is inserted at a border between a periphery of the first electrode plate and a periphery of the first distortion buffer plate.

Further, a recess is formed in the first electrode plate at a portion which faces the semiconductor body, a hole is formed in the first distortion buffer plate at a portion which faces the recess, and the restricting means includes a pin which extends from the recess into the hole.

Alternatively, a recess is formed in the first electrode plate at a portion which faces the semiconductor body, a through hole is formed in the first distortion buffer plate at a portion which faces the recess, and the restricting means includes: a second elastic element contained in the recess; and an electrode member extending from the recess to the through hole, the electrode member contacting the first major surface of the semiconductor body, the electrode member being biased by the second elastic element against the first major surface.

In the pressure contact type semiconductor device according to the first aspect of the present invention, the first and the second restraint means press the first distortion buffer plate against the first major surface of the semiconductor body, thereby restricting the relative positional relation between the first electrode plate and the first distortion buffer plate in the direction which is parallel with the first major surface of the semiconductor body and thereby restricting the relative positional relation between the second electrode plate and the second distortion buffer plate in the direction which is parallel with the second major surface of the semiconductor body. Therefore, without applying external pressure upon the semiconductor device, it is possible to prevent displacement of the first and the second distortion buffer plates due to vibration or impact during transportation and hence it is possible to prevent damage to the semiconductor body. This reduces a transportation cost and maintains a reliability of the semiconductor device.

According to the second aspect of the present invention, in the pressure contact type semiconductor device of the first aspect of the present invention, the first restraint means not only presses the first distortion buffer plate against the first major surface of the semiconductor body but also restricts the relative positional relation between the first electrode plate and the first distortion buffer plate in the direction which is parallel with the first major surface of the semiconductor body. In addition, since the first restraint means has a simple structure which is formed by the elastic element and the first pin, the first restraint means occupies only a small space in the pressure contact type semiconductor device.

In the pressure contact type semiconductor device according to the third aspect of the present invention, since the first hole is a through hole and the protrusion of the first pin extends beyond the hole a shorter length than the thickness of the first distortion buffer plate, the protrusion of the first pin is prevented from contacting and hence applying stress upon the semiconductor body. As a result, damage to the semiconductor body is prevented.

In the pressure contact type semiconductor device according to the fourth aspect of the present invention, since the first hole is a hole with a bottom, the protrusion of the first pin is prevented from contacting and hence applying stress upon the semiconductor body. As a result, damage to the semiconductor body is prevented.

In the pressure contact type semiconductor device according to the fifth aspect of the present invention, since the first restraint means is spatially separated into the biasing means for biasing the first distortion buffer plate and the restricting means, it is possible to form the first restraint means by optimal combination of the biasing means and the restricting means which is suitable to the configuration and the size of the pressure contact type semiconductor device. Further, the first elastic element, which is inserted at a border between a periphery of the first electrode plate and a periphery of the first distortion buffer plate, biases the first distortion buffer plate uniformly, thereby preventing an offset load upon and damage to the semiconductor body.

In the pressure contact type semiconductor device according to the sixth aspect of the present invention, since the first pin of a simple structure restricts the relative position of the first distortion buffer plate, the restricting means is easy to dispose.

In the pressure contact type semiconductor device according to the seventh aspect of the present invention, the relative position of the first distortion buffer plate is restricted by the second elastic element and the electrode member which is biased by the second elastic element against the first major surface of the semiconductor body. Hence, there is no need to dispose additional restricting means, which simplifies the structure of the pressure contact type semiconductor device.

In the pressure contact type semiconductor device according to the eighth aspect of the present invention, the relative position of the second distortion buffer plate is restricted by the third elastic element and the electrode member which is biased by the third elastic element against the second major surface of the semiconductor body. Hence, there is no need to dispose additional restricting means, which simplifies the structure of the pressure contact type semiconductor device.

In the pressure contact type semiconductor device according to the ninth aspect of the present invention, since the second pin of a simple structure restricts the relative position of the second distortion buffer plate, the restricting means is easy to dispose.

In the pressure contact type semiconductor device according to the tenth aspect of the present invention, the relative position of the second distortion buffer plate is restricted by the ring member which is engaged with peripheries of the second electrode plate and the second distortion buffer plate. Hence, in disposing the restricting means, it is easy to process the second electrode plate and the second distortion buffer plate.

In the pressure contact type semiconductor device according to the eleventh aspect of the present invention, since the second restraint means is replaced with the second distortion buffer plate which is engaged with the second electrode plate, the structure of the pressure contact type semiconductor device is simple.

Accordingly, it is an object of the present invention to obtain an alloy-free pressure contact type semiconductor device which maintains a high reliability even during transportation without a pressure contact tool such as a simplified stack and therefore which does not require a high transportation cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view of a pressure contact type semiconductor device according to a second preferred embodiment of the present invention;

DESCRIPTION OF THE PREFERRED EMBODIMENTS

<A. First Preferred Embodiment>
<A-1. Overall Structure of Device>

Figure 1:
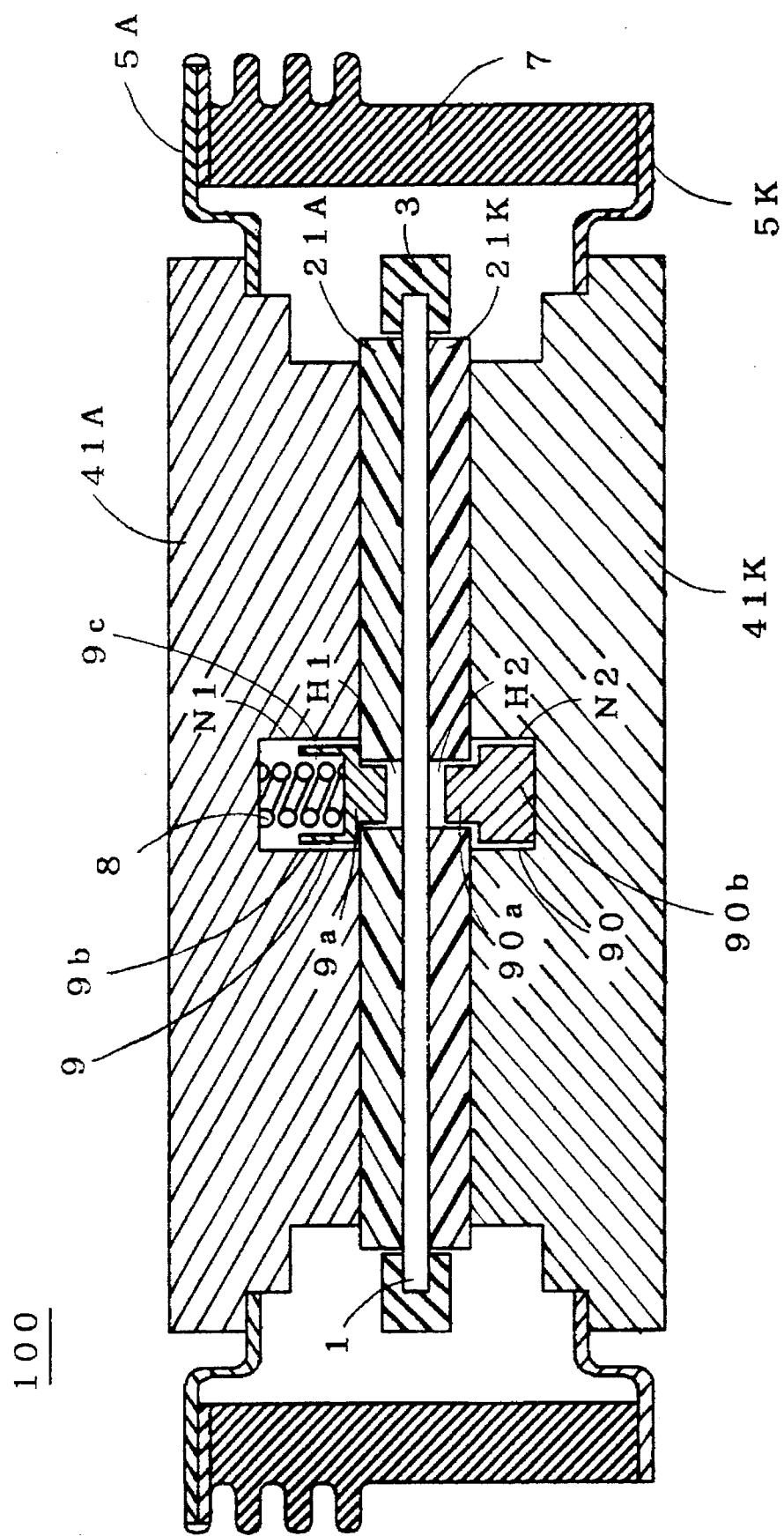
FIG. 1 is a cross-sectional view of a pressure contact type semiconductor device according to a first preferred embodiment of the present invention.

FIG. 1 is a cross-sectional view of a power diode which is structured as an alloy-free pressure contact type semiconductor device 100 according to a first preferred embodiment of the present invention. In FIG. 1, a semiconductor body 1 is formed by disposing an anode electrode layer and a cathode electrode layer in a top and a bottom major surfaces of a disk-shaped semiconductor substrate. The semiconductor substrate contains inside a known multi-layer semiconductor structure (specifically, a PN dual-layer structure) which is necessary for forming a diode. A protector 3 is fixed to a periphery of the semiconductor body 1 to prevent electric discharge from the periphery of the semiconductor body 1 and also to protect the periphery of the semiconductor body 1.

The semiconductor body may be any kind of semiconductor body as far as it includes at least one PN junction although the embodiment of FIG. 1 is a diode. The present invention has flexible applications regardless of the internal structure of the semiconductor body 1.

Disk-shaped distortion buffer plates 21A and 21K are disposed on the top and the bottom major surfaces of the semiconductor body 1, respectively. The distortion buffer plates 21A and 21K abut the semiconductor body 1 within the diameter of the semiconductor body 1 in such a manner that the distortion buffer plates 21A and 21K are approximately symmetrical in configuration and in location to each other with respect to the semiconductor body 1 when in the condition of FIG. 1. In addition, the distortion buffer plates 21A and 21K are not adjoined to the semiconductor body 1 by brazing or the like. That is, they are in an alloy-free contact. A anode electrode plate 41A and a cathode electrode plate 41K, both disk-shaped, are disposed on the distortion buffer plates 21A and 21 K, respectively, in an alloy-free contact to the surfaces of the distortion buffer plates 21A and 21K.

Through holes H1 and H2 each having a circular cross section are formed in the distortion buffer plates 21A and 21K at the center. A first and a second bottomed holes (i.e., recesses) N1 and N2 having larger diameters than the through holes H1 and H2 are formed in the anode electrode plate 41A and a cathode electrode plate 41K at the positions which correspond to the through holes H1 and H2. From the through hole H1 up to the first bottomed hole N1, a pressure contact pin 9 biased by a coil spring 8 is disposed. From the through hole H2 down to the second bottomed hole N2, a fixing pin 90 is disposed which fixes the radial direction position of the distortion buffer plate 21 K to prevent displacement of the distortion buffer plate 21K in the radial direction. The fixing pin 90 may be secured to the bottom of the bottomed hole N2 or may be simply inserted in the bottomed hole N2. A base portion 90b must not be loose within the bottomed hole N2 in the latter case structure. To this end, in the latter case structure, the base portion 90b of the fixing pin 90 is formed to have a size which is close to that of the bottomed hole N2.

The pressure contact pin 9 is formed by a cylindrical protrusion 9a and a base portion 9b which is larger in diameter than the protrusion 9a. The protrusion 9a and the base portion 9b are integral with each other. The base portion 9b is recessed on the opposite side to the protrusion 9a (hereinafter "bottom surface side").

The bottomed hole N1 has a slightly larger diameter than the base portion 9b of the pressure contact pin 9 while the through hole H1 has a slightly larger diameter than the protrusion 9a of the pressure contact pin 9. The bottomed hole N1 is deeper than the height of the base portion 9b of the pressure contact pin 9.

The coil spring 8 is inserted in the bottomed hole N1. The pressure contact pin 9 is further inserted so that the recessed portion of the bottom surface side encloses the coil spring 8. Due to the distortion buffer plate 21A, the pressure contact pin 9 biased by the coil spring 8 remains in the bottomed hole N1 instead of jumping out of the bottomed hole N1.

The base portion 9b of the pressure contact pin 9 which is under the biasing force of the coil spring 8 presses the distortion buffer plate 21A against the top major surface of the semiconductor body 1 to constrain the semiconductor body 1 in the vertical direction. At the same time, with the protrusion 9a of the pressure contact pin 9 inserted in the through hole H1, the relative positional relation between the distortion buffer plate 21A and the anode electrode plate 41A is restrained in the direction which is parallel to the top major surface of the semiconductor body 1 (i.e., in a radial direction).

On the other hand, the fixing pin 90 is formed by a cylindrical protrusion 90a and the base portion 90b which is larger in diameter than the protrusion 90a. The protrusion 90a and the base portion 90b are integral with each other. The base portion is flat on the opposite side to the protrusion 90a (hereinafter "bottom surface side").

The second bottomed hole N2 has a slightly larger diameter than the base portion 90b of the fixing pin 90 while the through hole H2 has a slightly larger diameter than the protrusion 90a of the fixing pin 90. The second bottomed hole N2 is formed to have such a depth which allows the protrusion 90a of the fixing pin 90 extends beyond the second bottomed hole N2 when the fixing pin 90 is inserted with the bottom surface side down.

In such a structure as above, with the fixing pin 90 inserted in the second bottomed hole N2 and the distortion buffer plate 21K disposed, the protrusion 90a of the fixing pin 90 is received by the through hole H2 of the distortion buffer plate 21K, whereby the relative positional relation between the distortion buffer plate 21K and the cathode electrode plate 41K is restrained in the direction which is parallel to the top major surface of the semiconductor body 1 (i.e., in the radial direction).

The protrusion 9a of the pressure contact pin 9 and the protrusion 90a of the fixing pin 90 are formed thinner than the distortion buffer plates 21A and 21K where the through holes H1 and H2 are formed receiving the protrusions 9a and 90a, in order to prevent a direct contact of the protrusions 9a and 90a of the pins 9 and 90 with the semiconductor body 1 and to protect the semiconductor body 1 from contact-induced stress.

Figure 14:
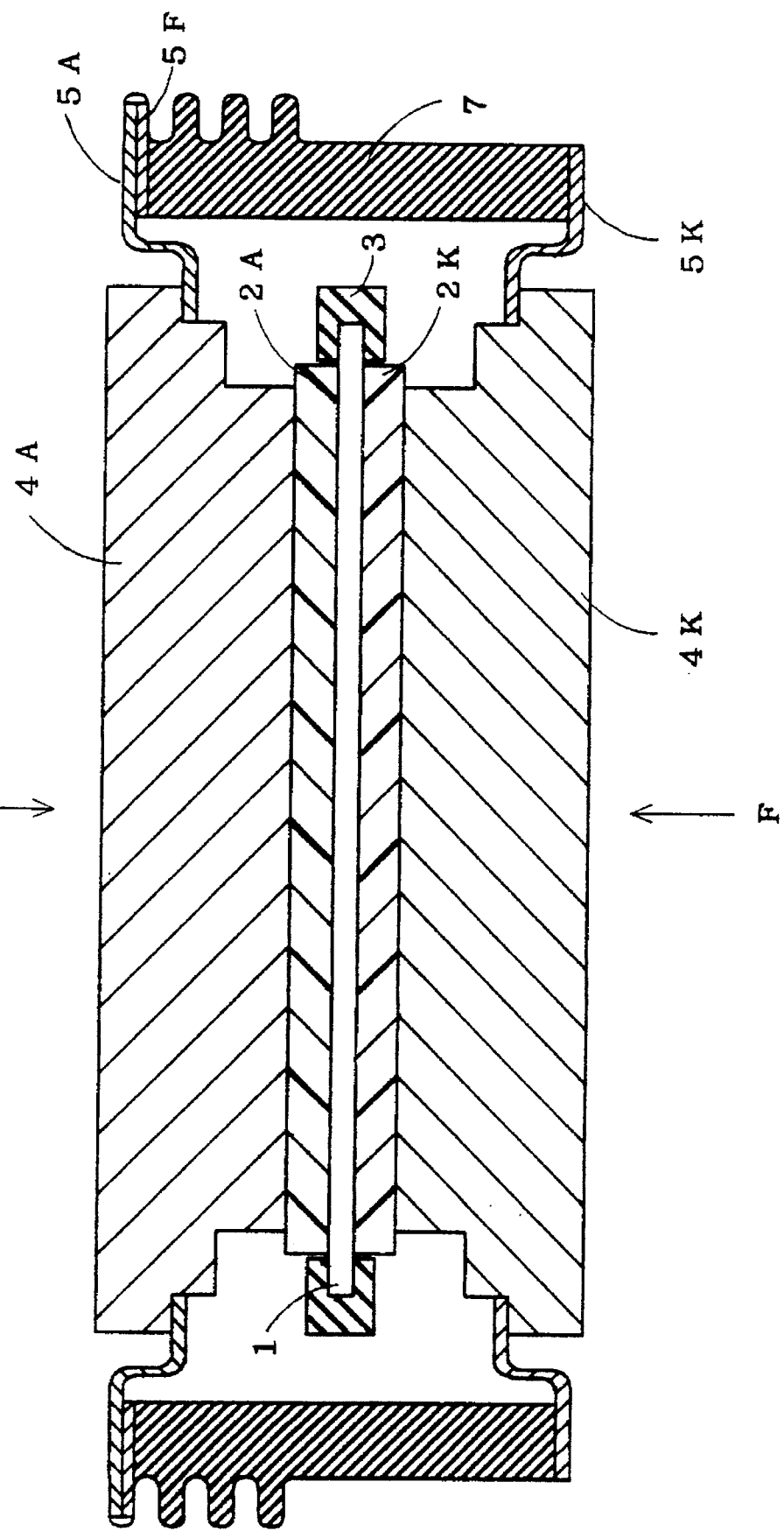
FIG. 14 is a cross-sectional view of a conventional pressure contact type semiconductor device.

The device 100 further comprises an anode flange 5A and a cathode flange 5K. The assembled structure above is housed in the casing 7 in the same manner as previously described with respect to the conventional device of FIG. 14, and therefore, a similar description is simply omitted here.

<A-2. Effect of First Preferred Embodiment>

Having such a structure as above, the pressure contact type semiconductor device 100 creates the following effects.

First, with the distortion buffer plate 21A pressed against the semiconductor body 1 by the pressure contact pin 9 which is biased by the coil spring 8, the semiconductor body 1 pressed by the distortion buffer plates 21A and 21K is restricted for vertical movement. The relative positional relation between the distortion buffer plate 21A and the anode electrode plate 41A is also restrained in the direction which is parallel to the top major surface of the semiconductor body 1.

Figure 2:
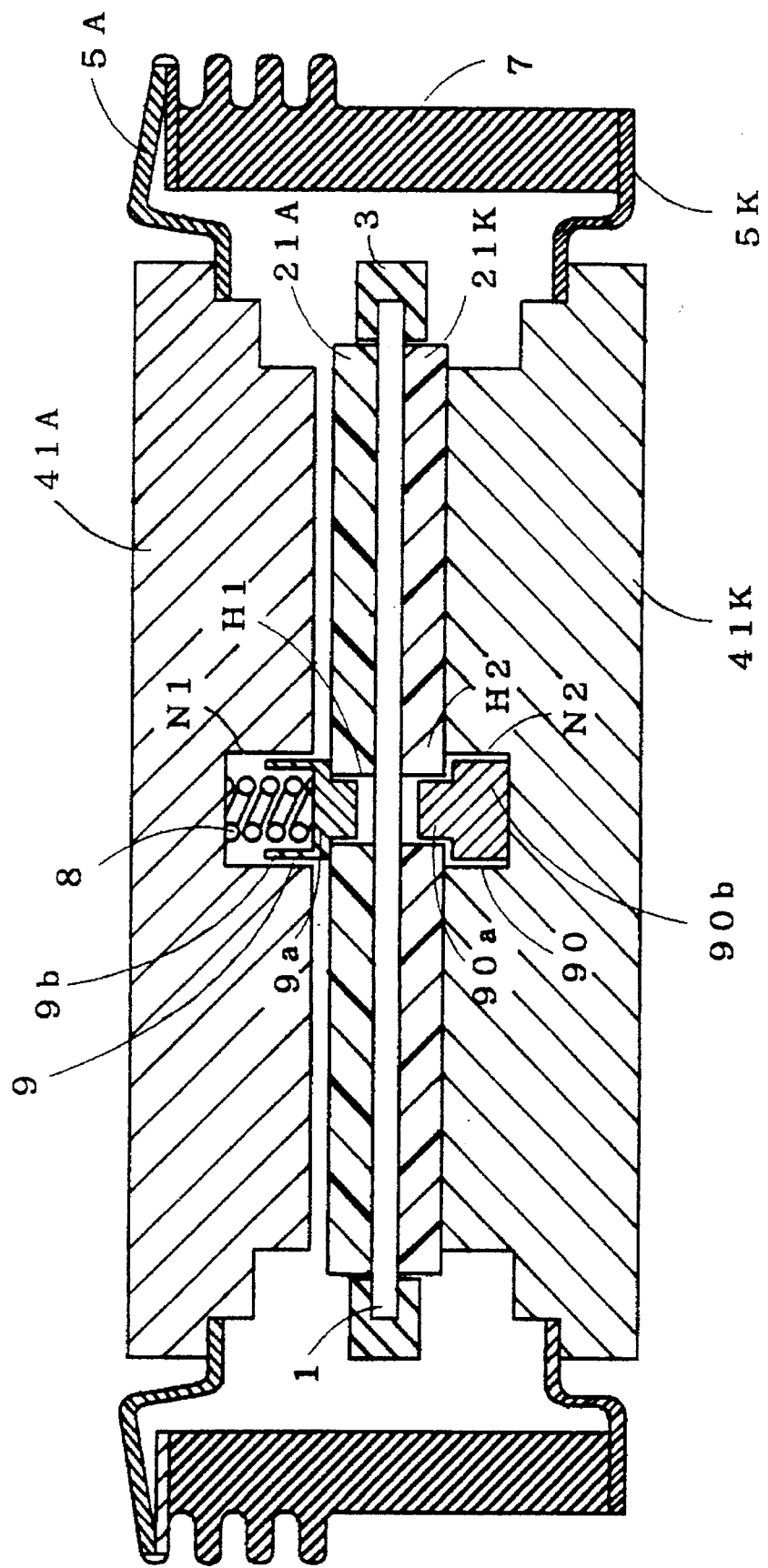
FIG. 2 is a cross-sectional view showing an operation of the pressure contact type semiconductor device of the first preferred embodiment of the present invention.

FIG. 2 is a cross-sectional view of the pressure contact type semiconductor device 100 of the present embodiment as it is with a gap created between the distortion buffer plate 21A and the anode electrode plate 41A due to warping of the anode flange 5A because of vibration or the like associated with transportation. In FIG. 2, the pressure contact pin 9 which is biased by the coil spring 8 presses the distortion buffer plate 21A against the semiconductor body 1 and restrains displacement of the semiconductor body 1 in a vertical direction.

In addition, since the fixing pin 90 restrains the relative positional relation between the distortion buffer plate 21K and the cathode electrode plate 41K in the direction which is parallel to the bottom major surface of the semiconductor body 1, there is no possibility that the semiconductor body 1 or the distortion buffer plates 21A and 21K will be displaced in the horizontal direction. Thus, damage to the semiconductor body 1 and the protector 3 is prevented.

Accordingly, even when subjected to external vibration or impact in the axial direction or in the radial direction, the semiconductor body 1 receives minimum offset load, which makes it unnecessary to transport the device under pressing force applied by means of a simplified stack. This reduces a transportation cost and prevents deterioration in the reliability of the device due to a crack which is created in the semiconductor substrate.

Further, since the fixing pin 90 is disposed at a position which corresponds to the position of the pressure contact pin 9 and the anode electrode plate 41A and the cathode electrode plate 41K are approximately symmetrical in configuration and in location to each other, stress from the above and stress from below upon the semiconductor body 1 are symmetrical to each other, which also reduces offset of a load upon the semiconductor body 1.

Still further, since the pressure contact pin 9 and the fixing pin 90 occupy a small space in the anode electrode plate 41A and the cathode electrode plate 41K, the presence of the pressure contact pin 9 and the fixing pin 90 reduces a deterioration in the cooling efficiency of the anode and the cathode electrode plates 41A and 41K to cool the semiconductor body 1, i.e., the efficiency of discharging heat through the distortion buffer plates 21A and 21K and the electrode plates 41A and 41K which is generated during the device operation in the semiconductor body 1.

The spring strength of the coil spring 8 must be set at an appropriate value to create such effects as above, which will be described below.

<A-3. Setting of Spring Strength of Coil Spring 8>

The spring constant of the coil spring 8 must be smaller than the overall spring constant of the anode flange 5A and the cathode flange 5K. It is also necessary to set the spring constant of the coil spring 8 so that a load per a unit area where the pressure contact pin 9 is in a direct contact with the distortion buffer plate 21A is smaller than a load per a unit area where the distortion buffer plate 21A is in a direct contact with the semiconductor body 1 of when the semiconductor device is used with the anode and the cathode electrode plates 41A and 41K pressed by the external force F (hereinafter "operation pressure contact load"). This is because the strengths of the semiconductor body 1 and the like are set with reference to the operation pressure contact load and it is not appropriate to apply extremely large force upon the semiconductor body 1 and the like by the coil spring 8. The coil spring 8 provides such pressure with which it is possible to keep the semiconductor body 1 sandwiched by the distortion buffer plates 21A and 21K even when external vibration or impact is applied.

If pressure contact type semiconductor device includes the semiconductor body 1 of a diameter of 100 mm, the overall spring constant of the anode flange 5A and the cathode flange 5K is between 300 to 500 kgf/mm$^2$. Where the maximum allowable acceleration of vibration associated with transportation by means of a truck is ±7.35 m/s$^2$, calculated from the weight of the internal components, the spring strength needed is equal to or larger than 5 kgf but equal to or smaller than 40 kgf if calculated from the operation pressure contact load and the area where the distortion buffer plate 21A is in a direct contact with the pressure contact pin 9. Hence, the spring strength of the coil spring 8 must be set within this range. This is also true of the spring strength of a corrugated spring 10 which is used in other preferred embodiments which will be described later (e.g., FIG. 7).

<A-4. Other Example of Structure of Through Holes H1 and H2>

Although the foregoing has described that the pressure contact pin 9 and the protrusion 90a of the fixing pin 90 are inserted into the through holes H1 and H2, the through holes H1 and H2 may be bottomed holes H10 and H20 each having a bottom which contacts the semiconductor body 1 as shown in FIG. 3.

Figure 3A:
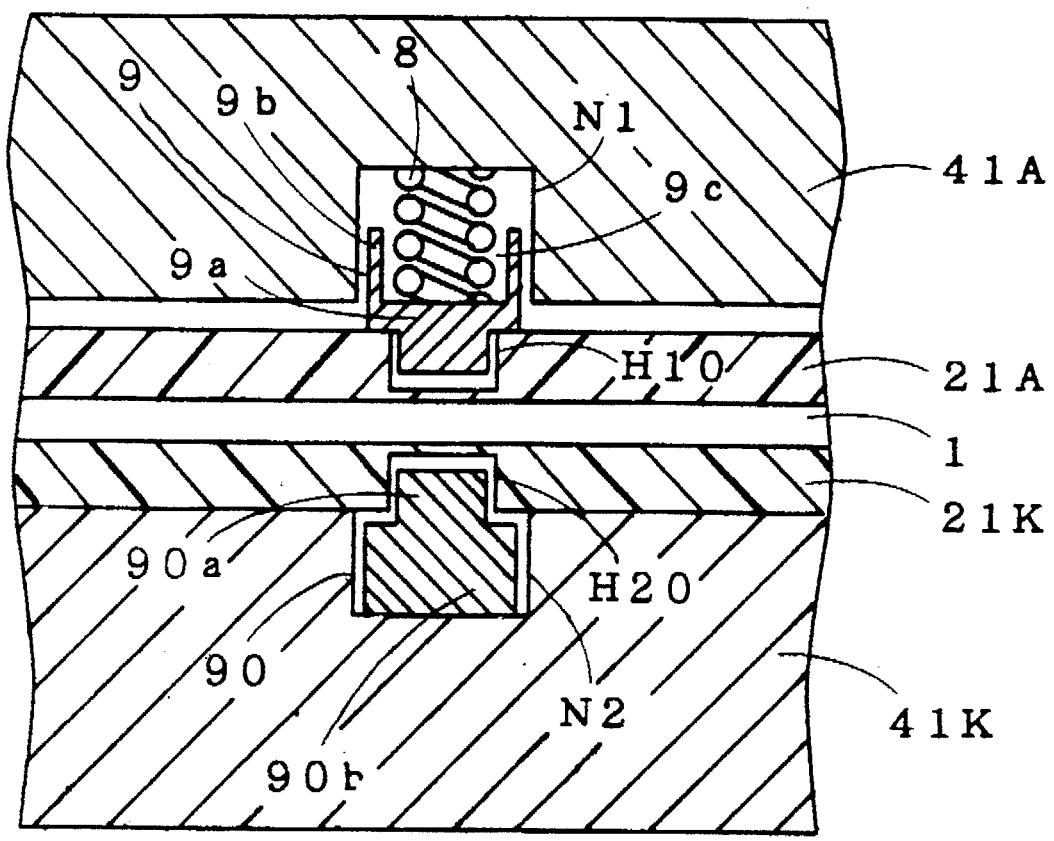
FIGS. 3A and 3B are views of a modification of the present invention.
Figure 3B:
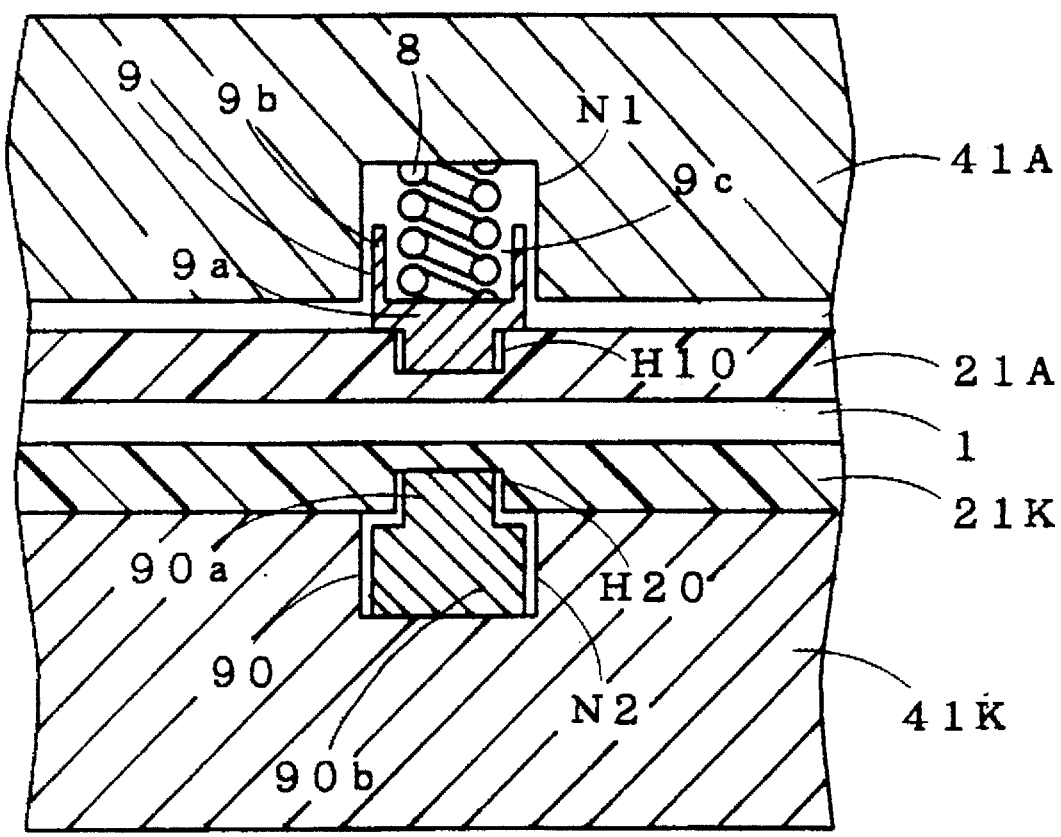

The bottomed holes H10 and H20 may be formed so that the tip portions of the protrusions 9a and 90a do not reach the bottoms of the bottomed holes H10 and H20 when the protrusions 9a and 90a of the pressure contact and the fixing pins 9 and 90 are inserted in the bottomed holes H10 and H20 (FIG. 3A). Alternatively, the bottomed holes H10 and H20 may be formed so that the tip portions of the protrusions 9a and 90a reach the bottoms of the bottomed holes H10 and H20 when the protrusions 9a and 90a of the pressure contact and the fixing pins 9 and 90 are inserted in the bottomed holes H10 and H20 (FIG. 3B). Such modification of the holes may be exercised in the other preferred embodiments which will be described later. Both the through holes H1 and H2 may be replaced with the bottomed holes H10 and H20, or only one of the through holes H1 and H2 may be replaced with the corresponding bottomed hole.

<B. Second Preferred Embodiment>

<B-1. Overall Structure of Device>

FIG. 4 is a cross-sectional view of a power diode which is structured as an alloy-free pressure contact type semiconductor device 200 according to a second preferred embodiment of the present invention. Although the device 100 of FIG. 1 according to the first preferred embodiment requires that the fixing pin 90, which is inserted to extend from the through hole H2 of the distortion buffer plate 21K to the bottomed hole N2 which is formed in the cathode electrode plate 41K to correspond to the through hole H2, restrains the relative positional relation between the distortion buffer plate 21K and the cathode electrode plate 41K in the direction which is parallel to the bottom major surface of the semiconductor body 1, in the device 200 of FIG. 4, a distortion buffer plate 22K is a disk plate without any hole formed therein and a fixing ring 60 is used instead of the fixing pin 90 as described below.

<B-2. Detailed Description of Fixing Ring 60>

The fixing ring 60 is stepped inside so that the inner diameter of a portion 60a which corresponds to the diameter of the periphery of the distortion buffer plate 22K is different from the inner diameter of a portion 60b which corresponds to the diameter of the periphery of a cathode electrode plate 42K. The fixing ring 60 is shaped so as to fit with the peripheries of the distortion buffer plate 22K and the cathode electrode plate 42K.

In the second preferred embodiment as shown in FIG. 4, on the top major surface side of the cathode electrode plate 42K, a first step 42a and a second step 42b, both concentric, are formed in this order in a radial direction from the center toward the periphery of the cathode electrode plate 42K. A planar portion which is continuous from the step 42b, as a base portion of the cathode electrode plate 42K, is connected to a cathode flange 5K. The diameter of the periphery of the cathode electrode plate 42K which is defined by the first step 42a is smaller than the diameter of the distortion buffer plate 22K. The diameter of the periphery of the cathode electrode plate 42K which is defined by the second step 42b is larger than the diameter of the distortion buffer plate 22K.

Figure 5:
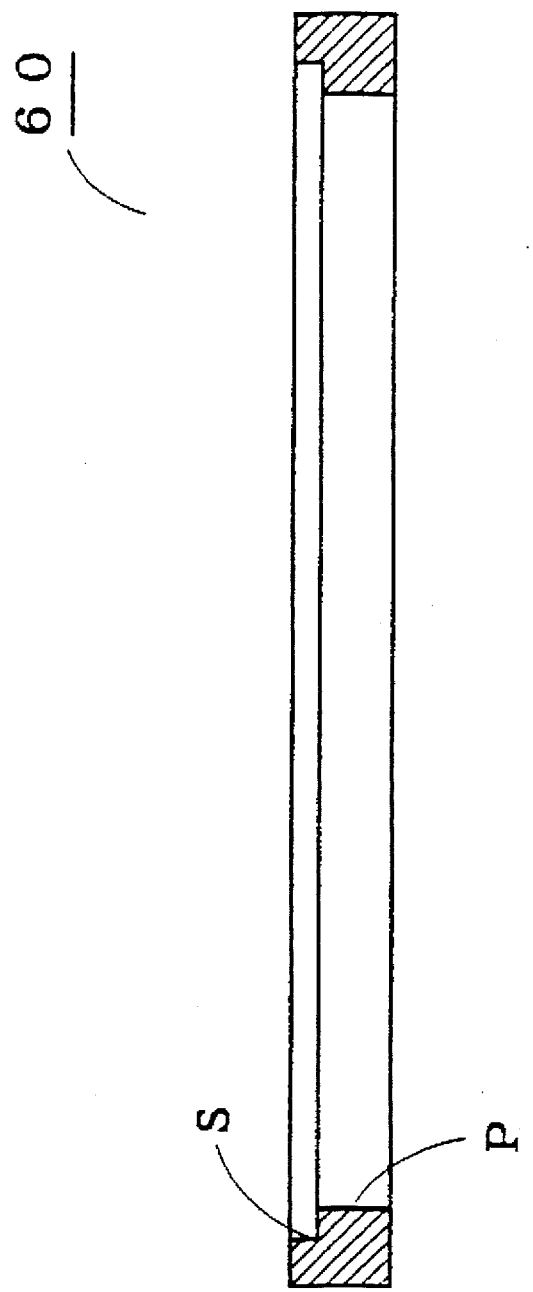
FIG. 5 is a cross-sectional view of a fixing ring used in pressure contact type semiconductor devices of the present invention.

FIG. 5 is a cross-sectional view of the fixing ring 60. In FIG. 5, an inner wall surface of the fixing ring 60 includes a step portion S which is defined by an inner diameter which corresponds to the diameter of the distortion buffer plate 22K and a vertical wall portion P which is defined by an inner diameter which is smaller than the inner diameter of the step portion S and which corresponds to the diameter of the periphery of the cathode electrode plate 42K which is defined by the first step 42a. The height of the vertical wall portion P is determined by the size of the first step 42a. The height of the fixing ring 60 is set so that the step portion S does not come into contact with the protector 3 of the periphery of the semiconductor body 1 when the fixing ring 60 is inserted into the first step 42a and the semiconductor body 1 is mounted on the distortion buffer plate 22K.

<B-3. Effect of Second Preferred Embodiment>

Having such a structure as above, the pressure contact type semiconductor device 200 creates the following effects.

Fitted into the fixing ring 60, the distortion buffer plate 22K and the cathode electrode plate 42K are fixed at the respective desired positions in the horizontal direction, and therefore, the relative positional relation between the distortion buffer plate 22K and the cathode electrode plate 42K is restrained in the horizontal direction.

Being similar to those previously explained in relation to the first preferred embodiment, effects created by the pressure contact pin 9 which is biased by the coil spring 8 will not be described here.

<B-4. Other Example of Structure of Fixing Ring 60>

The foregoing has described the fixing ring 60 as having such an inner wall structure which is suitable for a case where the diameter of the periphery of the cathode electrode plate 42K which is defined by the first step 42a is smaller than the diameter of the distortion buffer plate 22K. If the diameter of the periphery of the cathode electrode plate 42K which is defined by the first step 42a is the same as the diameter of the distortion buffer plate 22K, the fixing ring may be simply cylindrical without any step formed in the internal wall surface.

<C. Third Preferred Embodiment>

<C-1. Overall Structure of Device>

Figure 6:
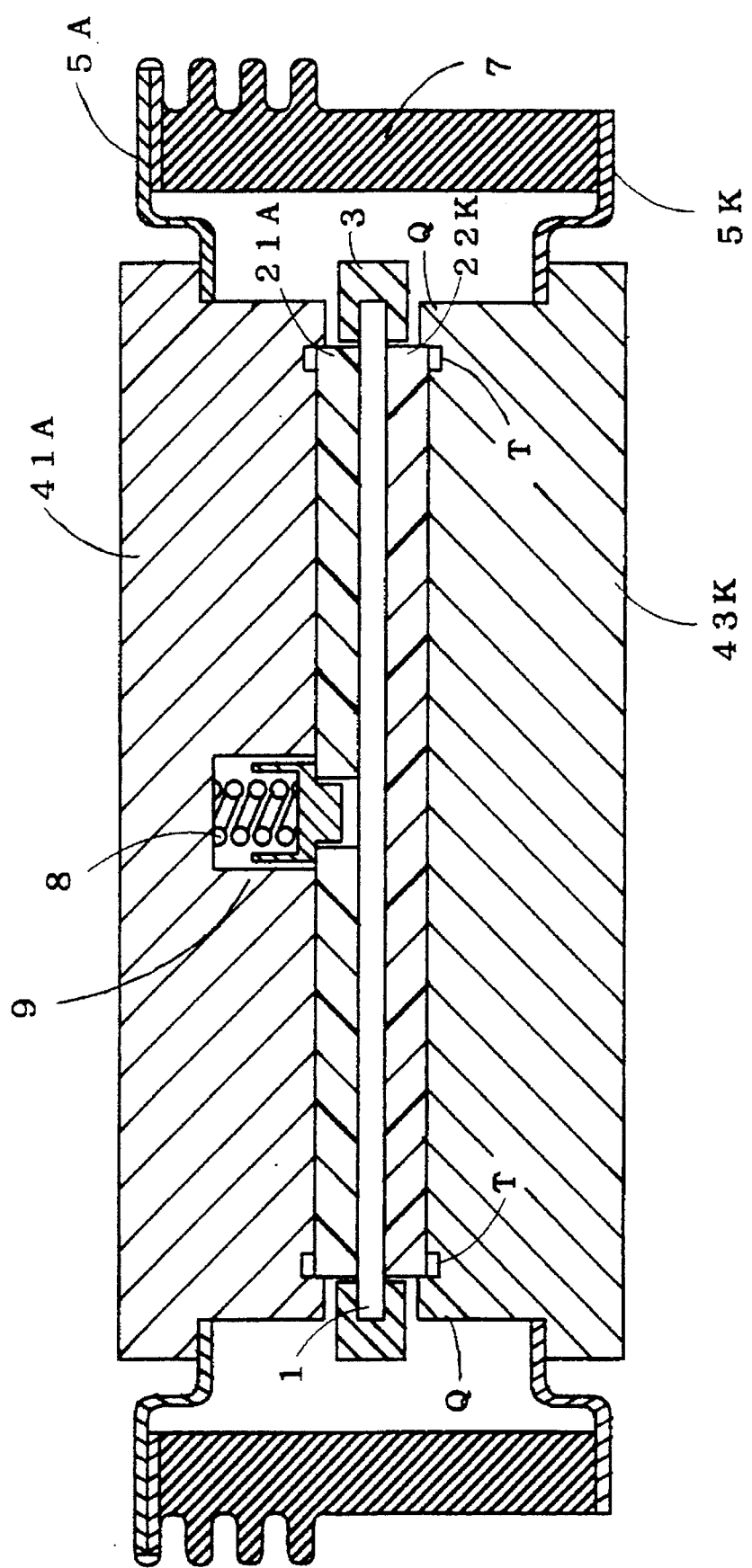
FIG. 6 is a cross-sectional view of a pressure contact type semiconductor device according third preferred embodiment of the present invention.

FIG. 6 is a cross-sectional view of a power diode which is structured as an alloy-free pressure contact type semiconductor device 300 according to a third preferred embodiment of the present invention. Although the devices according to the first and the second preferred embodiments use restraint means such as the fixing pin 90 and the fixing ring 60 in order to restrain the relative positional relation between the distortion buffer plate and the cathode electrode plate in the direction which is parallel to the bottom major surface of the semiconductor body 1, the distortion buffer plate may be engaged directly with the cathode electrode plate. To this end, the device must include a structure for engaging the distortion buffer plate with the cathode electrode plate.

As shown in FIG. 6, a cathode electrode plate 43K includes an engagement portion Q entirely across a periphery which contacts the distortion buffer plate 22K so as to engage with the periphery of the distortion buffer plate 22K. Since the device of FIG. 6 is the same as the device of the second preferred embodiment shown in FIG. 5 except for the cathode electrode plate 43K, a redundant description will be omitted here.

The engagement portion Q is a wall which is formed on the entire periphery of the cathode electrode plate 43K. The inner diameter defined by the engagement portion Q is slightly larger than the diameter of the distortion buffer plate 22K. Receiving the distortion buffer plate 22K inside, the engagement portion Q engages at its inner wall surface with the periphery of the cathode electrode plate 43K. The height of the engagement portion Q is determined in such a manner that the engagement portion Q does not contact the protector 3 of the periphery of the semiconductor body 1 when the semiconductor body 1 is mounted on the distortion buffer plate 22K.

A ring groove T is formed in a top major surface of the cathode electrode plate 43K along the inner wall of the engagement portion Q. The groove T defines the outer diameter of a contact surface in which the distortion buffer plate 22K and the cathode electrode plate 43K contact each other. The purpose of forming the groove T is to make this contact surface to have the same diameter as that of a contact surface in which the anode electrode plate 41A and the distortion buffer plate 21A contact each other.

<C-2. Unique Effect of Third Preferred Embodiment>

Having such a structure as above, the pressure contact type semiconductor device 300 creates the following effects.

Engaged with the engagement portion Q of the cathode electrode plate 43K, the distortion buffer plate 22K is restricted for movement in the horizontal direction. In addition, due to the pressure contact pin 9 which is biased by the coil spring 8, the effects as those previously explained in relation to the first preferred embodiment are created here as well.

Further, since no restraint means such as the fixing pin 90 and the fixing ring 60 is necessary, the device does not need an increased number of parts, which reduces a manufacturing cost.

<D. Fourth Preferred Embodiment>

Figure 7:
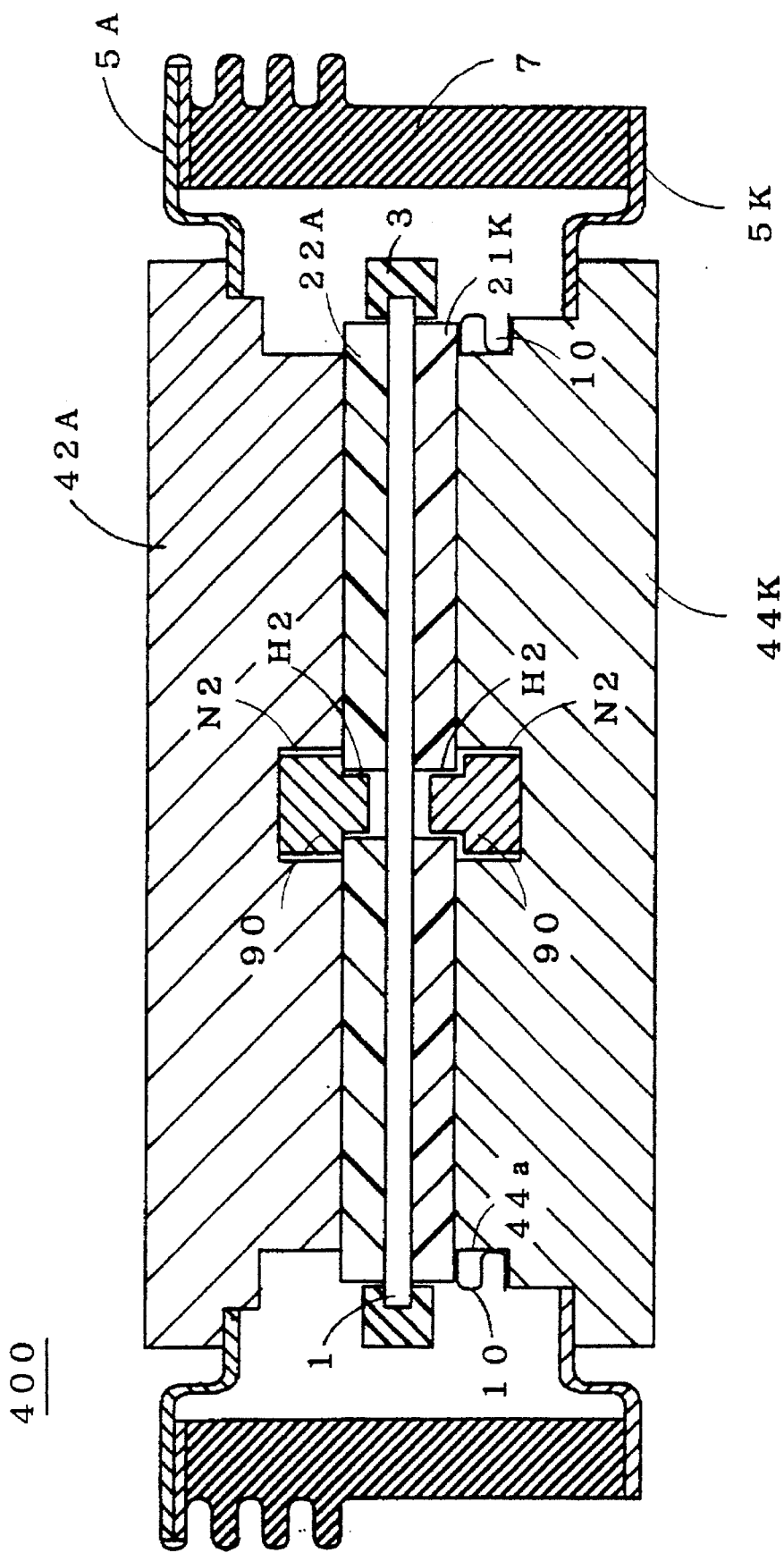
FIG. 7 is a cross-sectional view of a pressure contact type semiconductor device according to a fourth preferred embodiment of the present invention.

FIG. 7 is a cross-sectional view of a power diode which is structured as an alloy-free pressure contact type semiconductor device 400 according to a fourth preferred embodiment of the present invention. In FIG. 7, through holes H2 are formed at the center of distortion buffer plates 22A and 21K while bottomed holes N2 having larger diameters than the through holes H2 are formed in an anode electrode plate 42A and a cathode electrode plate 44K at positions which correspond to the through holes H2. From the through holes H2 up to the bottomed holes N2, the fixing pins 90 are inserted. The structure of the fixing pins 90 is the same as that previously described in relation to the first preferred embodiment, and therefore, a similar description will be omitted here.

In FIG. 7, a corrugated spring 10 is inserted at the border between the periphery of the cathode electrode plate 44K and the periphery of the distortion buffer plate 21K. The corrugated spring 10 is ring-shaped and inserted in a step 44a which is formed in the periphery of the cathode electrode plate 44K.

<D-2. Effect of Fourth Preferred Embodiment>

Having such a structure as above, the pressure contact type semiconductor device 400 creates the following effects.

With the fixing pins 90 inserted into the bottomed holes N2 and the distortion buffer plates 22A and 21K disposed on the both sides of the semiconductor body 1, the protrusions 90a of the fixing pins 90 are received by the through holes H2 and the relative positional relation between the distortion buffer plates 22A and 21K is restricted in the direction which is parallel to the top and the bottom major surfaces of the semiconductor body 1. In addition, with the distortion buffer plate 22A biased against from one side and the distortion buffer plate 21K biased against from the other side because of the corrugated spring 10, the semiconductor body 1 is restrained for vertical movement. This prevent damage to the semiconductor body 1 and the protector 3 due to relative displacement between the semiconductor body 1 and the distortion buffer plate 22A or 21K.

Further, since the distortion buffer plate 21K biased by the corrugated spring 10 is subjected to force thereupon in a large area, there is no concentration of force locally acting on the distortion buffer plate 21K.

<D-3. Other Example of Distortion Buffer Plate 21 K>

In the fourth preferred embodiment described above, the step 44a is formed in the periphery of the cathode electrode plate 44K and the corrugated spring 10 is fitted in the step 44a. However, the corrugated spring 10 may be inserted in a ring-shaped groove T which is formed in the top major surface of the cathode electrode plate 44K not at the periphery but closer to the center of the cathode electrode plate 44K.

<E. Fifth Preferred Embodiment>

<E-1. Overall Structure of Device>

Figure 8:
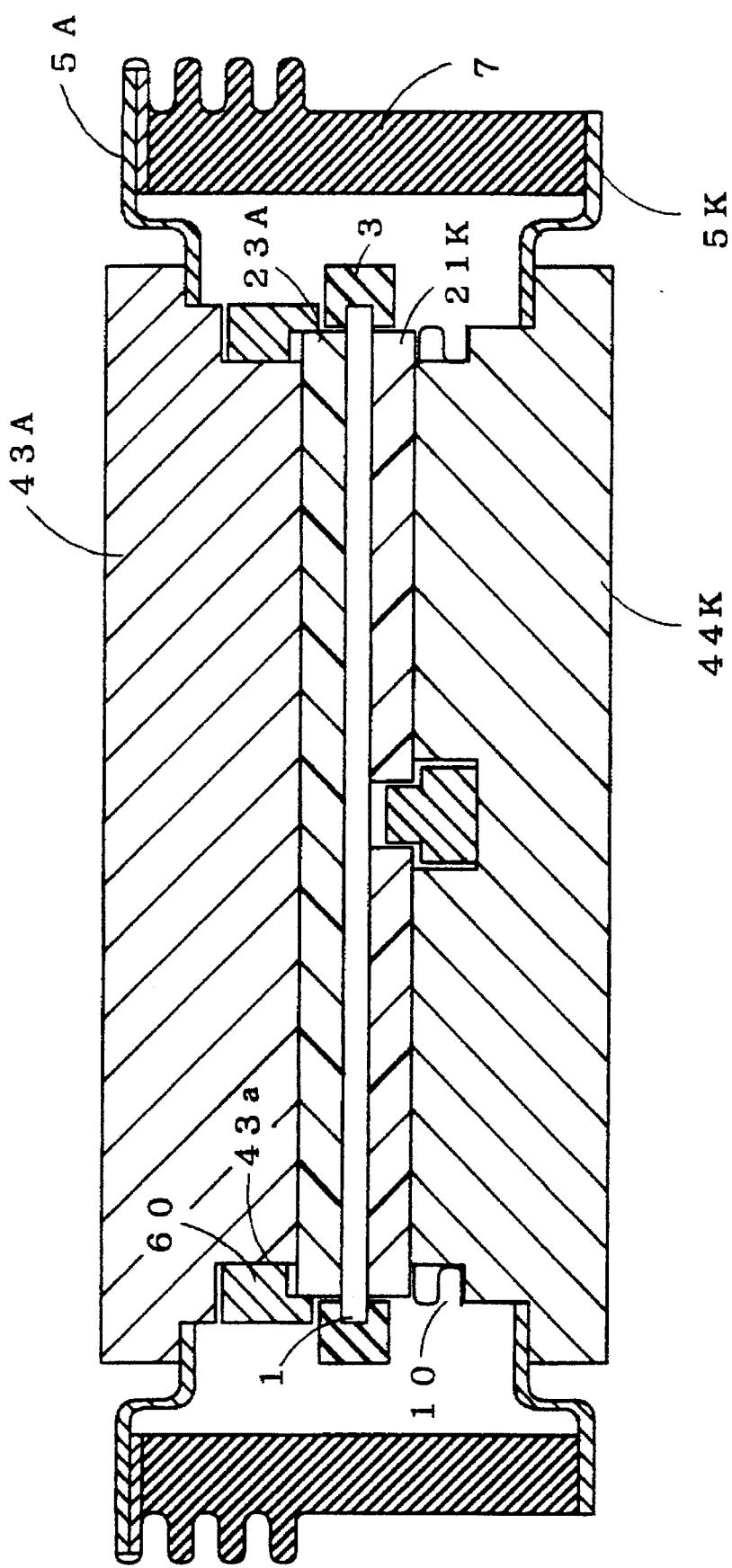
FIG. 8 is a cross-sectional view of a pressure contact type semiconductor device according to a fifth preferred embodiment of the present invention.

FIG. 8 is a cross-sectional view of a power diode which is structured as an alloy-free pressure contact type semiconductor device 500 according to a fifth preferred embodiment of the present invention.

In the fourth preferred embodiment, the fixing pin 90 inserted to extend from the through hole H2 of the distortion buffer plate 22A to the bottomed hole N2 which is formed in the anode electrode plate 42A at the position corresponding to the through hole H2 restrains the relative positional relation between the distortion buffer plate 22A and the anode electrode plate 42A in the direction which is parallel to the top major surface of the semiconductor body 1. However, in the fifth preferred embodiment of FIG. 8, instead of the fixing pin 90, the fixing ring 60 of the second preferred embodiment may be engaged with an anode electrode plate 43A and a distortion buffer plate 23A to restrict the relative positional relation between the anode electrode plate 43A and the distortion buffer plate 23A as shown in FIG. 8.

Here, since the structure of the fixing ring 60 has been already described in relation with the second preferred embodiment, a similar description will be simply omitted. Differently from the second preferred embodiment, the fixing ring 60 engages with the anode electrode plate 43A instead of the cathode electrode plate 42K, a first step 43a instead of the first step 42a and the distortion buffer plate 23A instead of the distortion buffer plate 22K.

<E-2. Effect of Fifth Preferred Embodiment>

Having such a structure as above, the pressure contact type semiconductor device 500 creates the following effects.

When the fixing ring 60 is inserted into the first step 43a of the anode electrode plate 43A, a distance which the distortion buffer plate 23A can move is limited to a sum of a distance which the fixing ring 60 fitted in the first step 43a can move in the horizontal direction and a distance which the distortion buffer plate 23A itself can move within the fixing ring 60 in the horizontal direction. Here, since the distance which the distortion buffer plate 23A can move is substantially zero, a relative positional relation between the distortion buffer plate 23A and the anode electrode plate 43A is restrained in the direction which is parallel to the top major surface of the semiconductor body 1.

As to effects created by providing the fixing pin 90 and the corrugated spring 10 which are the same as those previously explained in relation to the fourth preferred embodiment, a similar description will be simply omitted.

<F. Sixth Preferred Embodiment>

<F-1. Overall Structure of Device>

Figure 9:
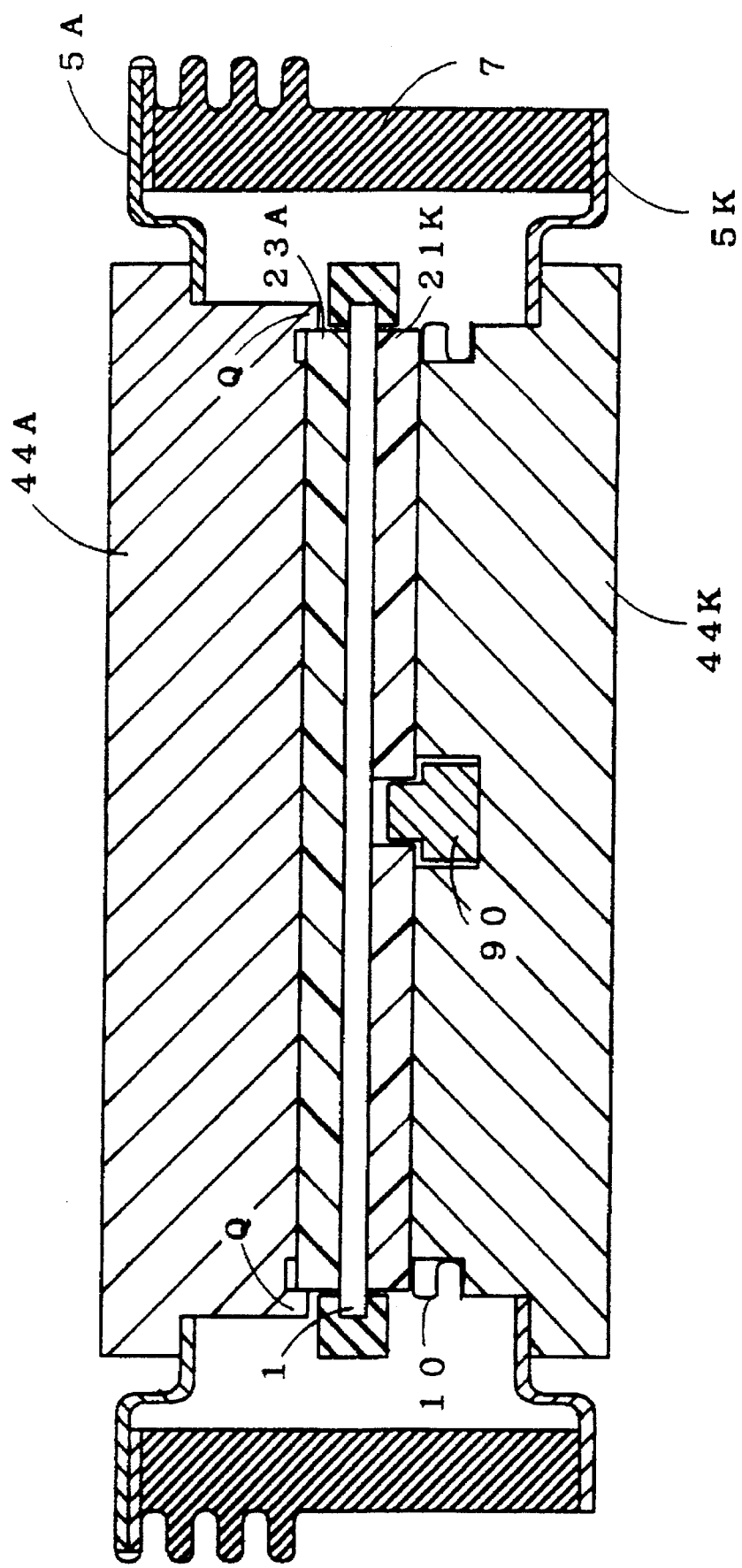
FIG. 9 is a cross-sectional view of a pressure contact type semiconductor device according to a sixth preferred embodiment of the present invention.

FIG. 9 is a cross-sectional view of a power diode which is structured as an alloy-free pressure contact type semiconductor device 600 according to a sixth preferred embodiment of the present invention.

Although the fourth and the fifth preferred embodiments above use restraint means such as the fixing pin 90 and the fixing ring 60 in order to restrain the relative position of the distortion buffer plate in the direction which is parallel to the top major surface of the semiconductor body 1, the distortion buffer plate may be engaged directly with the anode electrode plate. To this end, the device must include a structure for engaging the distortion buffer plate with the anode electrode plate.

Here, since the structure of an anode electrode plate 44A is similar to that of the cathode electrode plate 43K previously explained in relation to the third preferred embodiment, a redundant description will be simply omitted. The anode electrode plate 44A engages with a distortion buffer plate 23A in the same manner in which the cathode electrode plate 43K engages with the distortion buffer plate 22K.

<F-2. Effect of Sixth Preferred Embodiment>

Having such a structure as above, the pressure contact type semiconductor device 600 creates the following effects.

The distortion buffer plate 23A engaged with the engagement portion Q of the anode electrode plate 44A is restrained in terms of a distance it can move in the horizontal direction. Effects created by providing the fixing pin 90 and the corrugated spring 10 are the same as those previously explained in relation to the fourth preferred embodiment.

Since no restraint means such as the fixing pin 90 and the fixing ring 60 of the first and the second preferred embodiments is necessary, the device does not need an increased number of parts, which reduces a manufacturing cost.

<G. Seventh Preferred Embodiment>

Although the foregoing has described the present invention as applicable to a power diode in relation with the first to the sixth preferred embodiments, the present invention may be applied to other types of semiconductor device which comprises a control electrode such as a power gate turn-on thyristor (hereinafter "GTO").

<G-1. Overall Structure of Device>

Figure 10:
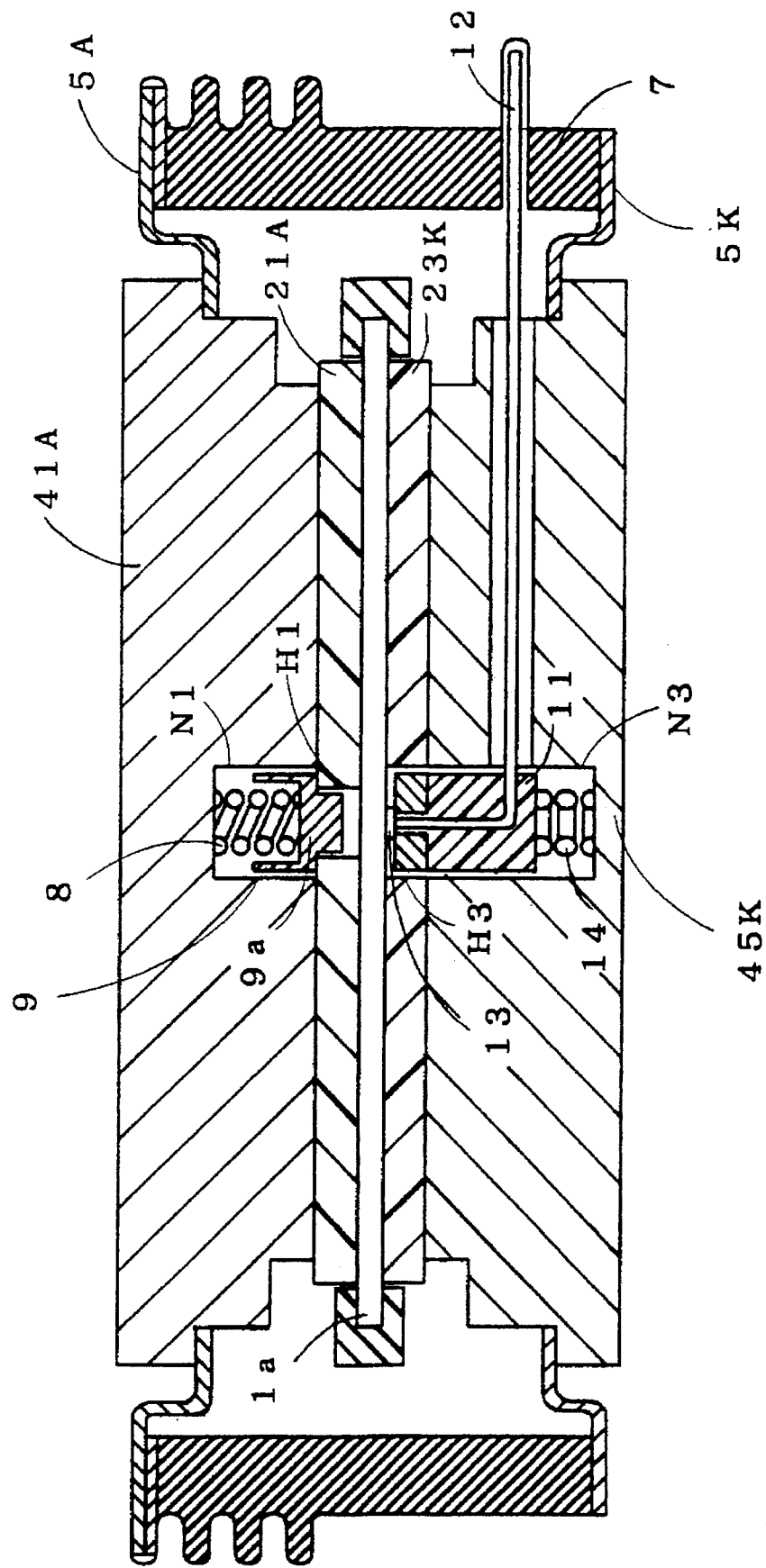
FIG. 10 is a cross-sectional view of a pressure contact type semiconductor device according to a seventh preferred embodiment of the present invention.

FIG. 10 is a cross-sectional view of a power GTO which is structured as an alloy-free pressure contact type semiconductor device 700 according to a seventh preferred embodiment of the present invention. In FIG. 10, a semiconductor body 1a includes a disk-shaped semiconductor substrate. An anode electrode layer and a cathode electrode layer are formed in a top and a bottom major surfaces, respectively, of the semiconductor substrate. In the center of the bottom major surface, a gate electrode layer is formed. The semiconductor substrate includes a known multi-layer semiconductor structure (which includes a PNPN four-layer structure and an additional layer) which is needed to form a thyristor. The distortion buffer plates 21A and 23K are disposed on the top and the bottom major surfaces, respectively, of the semiconductor body 1a in an alloy-free contact. A gate electrode 13 which is formed at a tip of a gate electrode support member 11 is disposed at the center of the bottom major surface of the semiconductor body 1a.

Through holes H1 and H3 are formed in the distortion buffer plates 21A and 23K at the center, respectively. Bottomed holes N1 and N3 having larger diameters than the through holes H1 and H3 are formed in the anode electrode plate 41A and a cathode electrode plate 45K at positions which correspond to the through holes H1 and H3. From the through hole H1 up to the bottomed hole N1, the pressure contact pin 9 biased by the coil spring 8 is disposed. From the through hole H3 down to the second bottomed hole N3, the insulation gate electrode support member 11 which is biased by an elastic element (i.e., coil spring) 14 is inserted for free slide movement. The gate electrode 13 is connected to an end of an L-shaped conductive wire 12 which extends outside the casing 7.

As to the structure of the pressure contact pin 9 and the coil spring 8 which are the same as those previously explained in relation to the first preferred embodiment, a similar description will be simply omitted.

<G-2. Effect of Seventh Preferred Embodiment>

Having such a structure as above, the pressure contact type semiconductor device 700 creates the following effects.

In this device structure, the coil spring 8 and the pressure contact pin 9 are inserted in the bottomed hole N1, the gate electrode support member 11 is inserted in the bottomed hole N2, and the distortion buffer plates 21A and 23K are disposed to sandwich the semiconductor body 1a. The protrusion 9a of the pressure contact pin 9 biased by the coil spring 8 is therefore inserted into the through hole H1, thereby restricting a relative positional relation between the distortion buffer plate 21A and the anode electrode plate 41A in the direction which is parallel to the top major surface of the semiconductor body 1a. Since the gate electrode support member 11 is inserted in the through hole H3, a relative positional relation between the distortion buffer plate 23K and the cathode electrode plate 45K is restricted in the direction which is parallel to the bottom major surface of the semiconductor body 1a (i.e., in the radial direction).

Pressed against by the distortion buffer plate 23K and the distortion buffer plate 21A which is biased by the coil spring 8 through the pressure contact pin 9, the semiconductor body 1a is restricted for movement in the vertical direction. This prevents damage to the semiconductor body 1a and the protector 3 due to relative displacement between the semiconductor body 1a and the distortion buffer plate 21A or 23K.

The seventh preferred embodiment and the following eighth to the tens preferred embodiments are characterized in that the gate electrode support member 11 is used as restraint means for restricting the distortion buffer plate 23K as well so that no additional restraint means is necessary.

H. Eighth Preferred Embodiment
H-1. Overall Structure of Device

Figure 11:
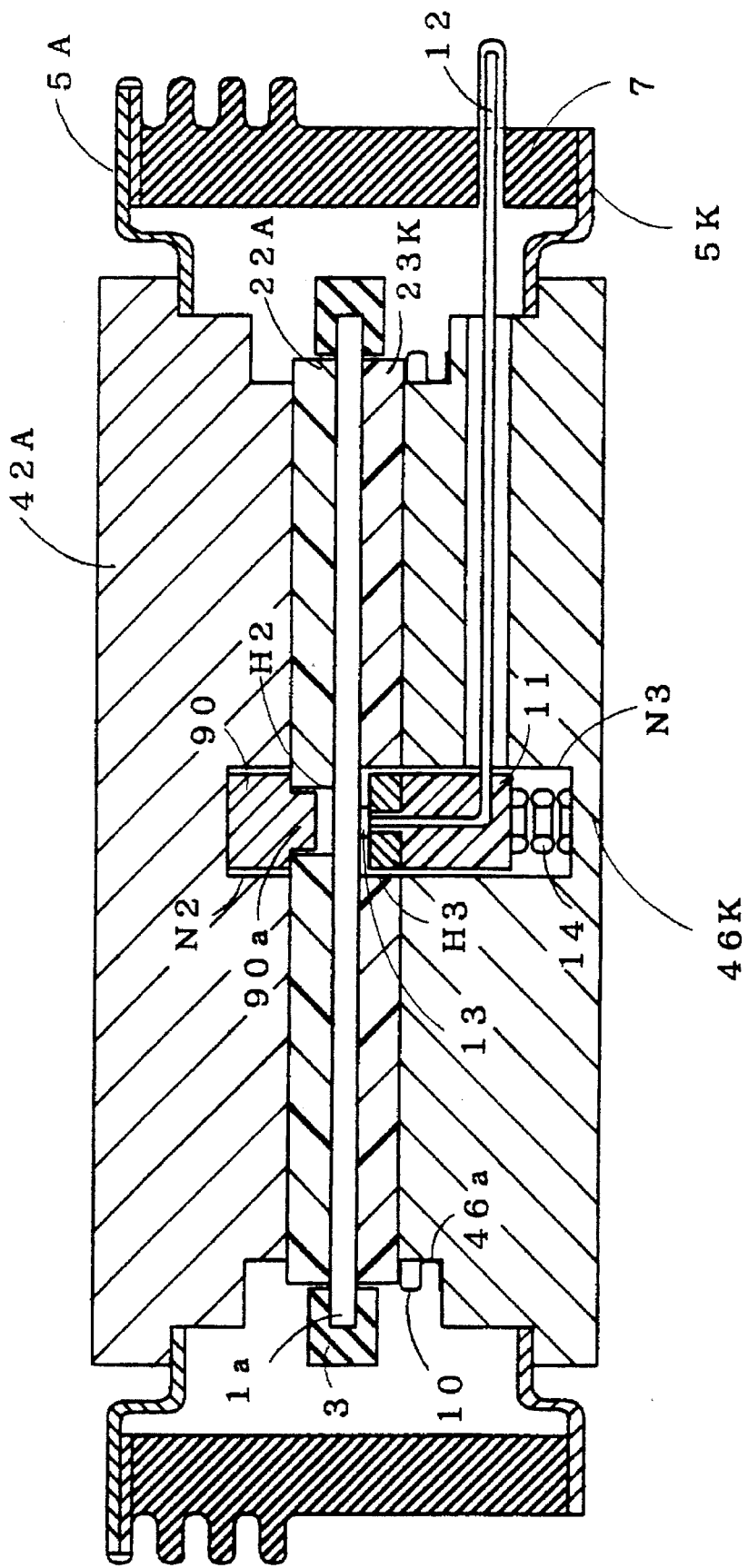
FIG. 11 is a cross-sectional view of a pressure contact type semiconductor device according to an eighth preferred embodiment of the present invention.

FIG. 11 is a cross-sectional view of a power GTO which is structured as an alloy-free pressure contact type semiconductor device 800 according to an eighth preferred embodiment of the present invention. In FIG. 11, through holes H2 and H3 are formed in the distortion buffer plates 22A and 23K at the center, respectively. Bottomed holes N2 and N3 having larger diameters than the through holes H2 and H3 are formed in the anode electrode plate 42A and a cathode electrode plate 46K at positions which correspond to the through holes H2 and H3. The fixing pin 90 extends from the through hole H2 to the bottomed hole N2 while the gate electrode support member 11 which is biased by the elastic element 14 is inserted to extend from through hole H3 to the bottomed hole N3 for free slide movement.

Since the structure associated with the gate electrode 13 including that of the gate electrode support member 11 is similar to those previously explained in relation to the seventh preferred embodiment, a redundant description will be simply omitted. The structure of the fixing pin 90, already described in relation to the first preferred embodiment, will be also omitted.

In FIG. 11, the corrugated spring 10 is inserted at the border between the periphery of the cathode electrode plate 46K and the periphery of the distortion buffer plate 23K. The corrugated spring 10 is ring-shaped and inserted in a step 46a which is formed in the periphery of the cathode electrode plate 46K.

H-2. Effect of Eighth Preferred Embodiment

Having such a structure as above, the pressure contact type semiconductor device 800 creates the following effects.

In this device structure, the fixing pin 90 is inserted in the bottomed hole N2, the gate electrode support member 11 is inserted in the bottomed hole N3, and the distortion buffer plates 22A and 23K are disposed to sandwich the semiconductor body 1a. The protrusion 90a of the fixing pin 90 is therefore inserted into the through hole H2, thereby restricting a relative positional relation between the distortion buffer plate 22A and the anode electrode plate 42A in the direction which is parallel to the top major surface of the semiconductor body 1a. Since the gate electrode support member 11 is inserted in the through hole H3, a relative positional relation between the distortion buffer plate 23K and the cathode electrode plate 46K is restricted in the direction which is parallel to the bottom major surface of the semiconductor body 1a.

Pressed against by the distortion buffer plate 22A and the distortion buffer plate 23K which is biased by the corrugated spring 10, the semiconductor body 1a is restricted for movement in the vertical direction. This prevents damage to the semiconductor body 1a and the protector 3 due to relative displacement between the semiconductor body 1a and the distortion buffer plate 22A or 23K.

In addition, since the fixing pin 90 is disposed at a position which corresponds to the gate electrode support member 11, and the anode electrode plate 42A and the cathode electrode plate 46K are approximately symmetrical with respect to each other in terms of configuration, stress upon the semiconductor body 1a is also approximately symmetrical. Hence, an offset load upon the semiconductor body 1a is reduced. Further, by forming the fixing pin 90 to have the same size as the gate electrode support member 11, the anode electrode plate 42A and the cathode electrode plate 46K have the same ability of cooling the semiconductor body 1a. This prevents uneven distribution of heat in the semiconductor body 1a.

I. Ninth Preferred Embodiment
I-1. Overall Structure of Device

Figure 12:
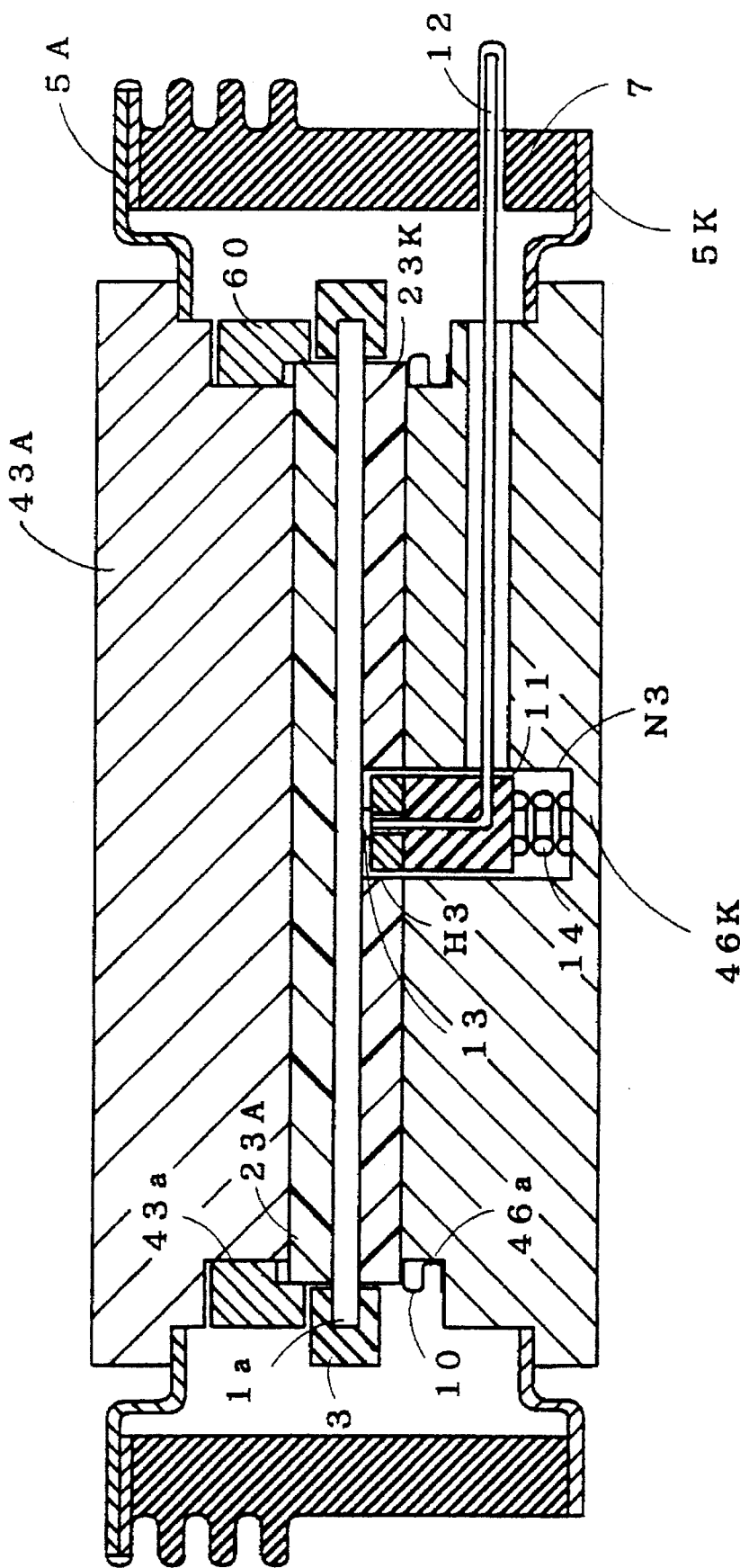
FIG. 12 is a cross-sectional view of a pressure contact type semiconductor device according to a ninth preferred embodiment of the present invention.

FIG. 12 is a cross-sectional view of a GTO which is structured as an alloy-free pressure contact type semiconductor device 900 according to an ninth preferred embodiment of the present invention. Although the eighth preferred embodiment of FIG. 11 requires that the fixing pin 90 is disposed to extend from the through hole H2 of the distortion buffer plate 22A to the bottomed hole N2 which is formed in the anode electrode plate 42A at the position corresponding to the through hole H2 in order to restrict the relative positional relation between the distortion buffer plate 22A and the anode electrode plate 42A in the direction which is parallel to the top major surface of the semiconductor body 1a, the ninth preferred embodiment of FIG. 12 replaces the fixing pin 90 with the fixing ring 60 of the second preferred embodiment. The fixing ring 60 is engaged with the anode electrode plate 43A and the distortion buffer plate 23A so that the relative positional relation between the distortion buffer plate 23A and the anode electrode plate 43A is restricted.

As to the structure of the fixing ring 60 which is the same as those previously explained in relation to the second preferred embodiment, a similar description will be simply omitted. Unlike in the second preferred embodiment, the fixing ring 60 engages with the anode electrode plate 43A instead of the cathode electrode plate 42K, the first step 43a instead of the first step 42a, and the distortion buffer plate 23A instead of the distortion buffer plate 22K.

The structure of the cathode electrode plate 46K, the gate electrode support member 11 and etc. is the same as those previously explained in relation to the eighth preferred embodiment, and therefore, a redundant description will be omitted.

I-2. Effect of Ninth Preferred Embodiment

Having such a structure as above, the pressure contact type semiconductor device 900 creates the following effects.

Since the distortion buffer plate 23A and the anode electrode plate 43A are fitted into the fixing ring 60, the positions of the distortion buffer plate 23A and the anode electrode plate 43A are determined in the horizontal direction. Therefore, the relative positional relation between the distortion buffer plate 23A and the anode electrode plate 43A is restricted in the horizontal direction.

J. Tenth Preferred Embodiment
J-1. Overall Structure of Device

Figure 13:
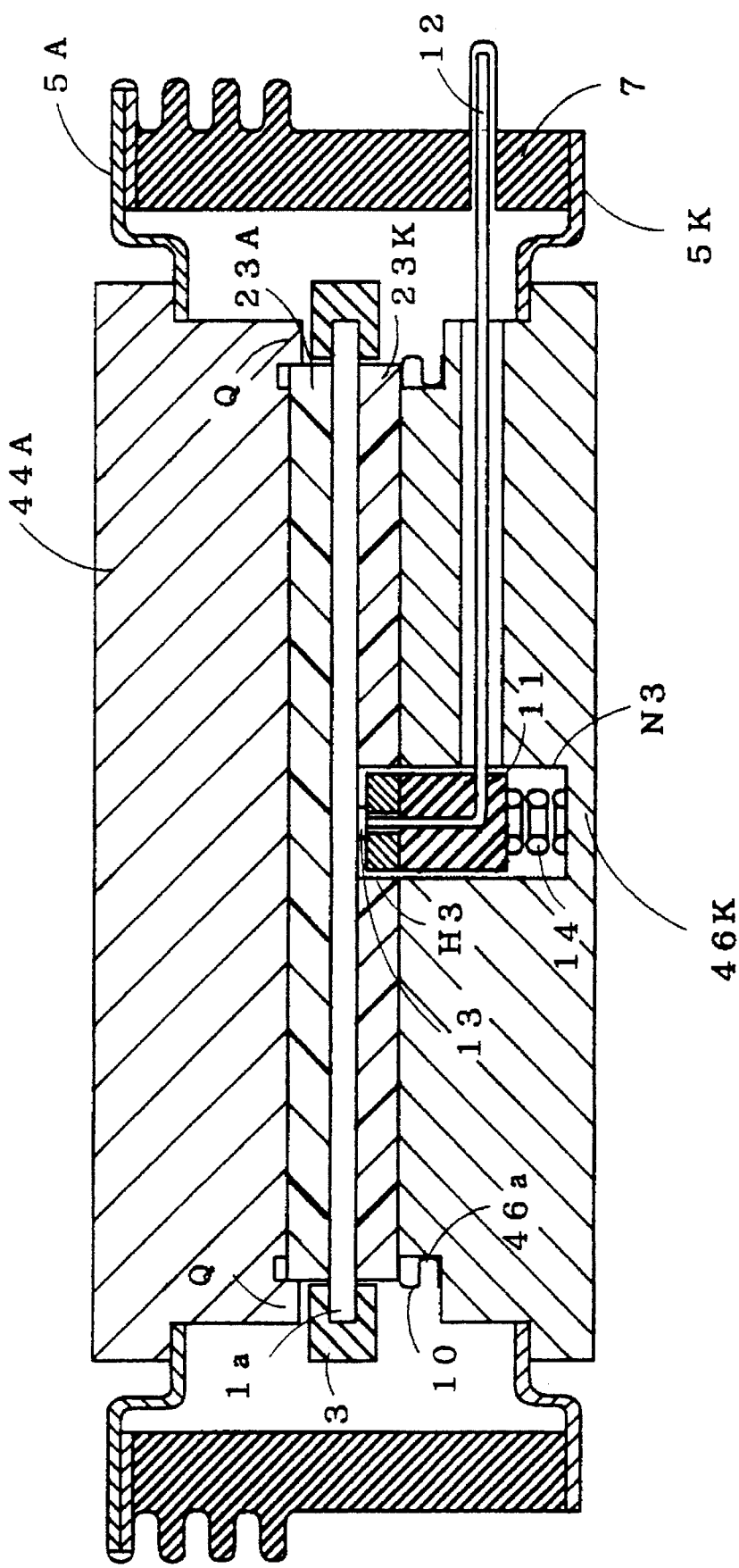
FIG. 13 is a cross-sectional view of a pressure contact type semiconductor device according to a tenth preferred embodiment of the present invention.

FIG. 13 is a cross-sectional view of a GTO which is structured as an alloy-free pressure contact type semiconductor device 1000 according to a tenth preferred embodiment of the present invention. Although the eight and the ninth preferred embodiments above use restraint means such as the fixing pin 90 and the fixing ring 60 in order to restrict the relative position of the distortion buffer plate in the direction which is parallel to the top major surface of the semiconductor body 1a, the distortion buffer plate may be engaged directly with the anode electrode plate. To this end, the device must include a structure for engaging the distortion buffer plate with the anode electrode plate.

Here, since the structure of the engagement portion of the anode electrode plate 44A is the same as that of the cathode electrode plate 43K of the third preferred embodiment, a similar description will be simply omitted. Where the electrode plate engages is different from the third preferred embodiment.

That is, the anode electrode plate 44A engages with the distortion buffer plate 23A in the same manner in which the cathode electrode plate 43K engages with the distortion buffer plate 22K.

<J-2. Effect of Tenth Preferred Embodiment>

Having such a structure as above, the pressure contact type semiconductor device 1000 creates the following effects.

The distortion buffer plate 23A engaged with the engagement portion Q of the anode electrode plate 44A is restrained in terms of a distance it can move in the horizontal direction. Effects created by providing the fixing pin 90 and the corrugated spring 10 are the same as those previously explained in relation to the seventh preferred embodiment.

Since no restraint means such as the fixing pin 90 and the fixing ring 60 of the eighth and the ninth preferred embodiments is necessary, the device does not need an increased number of parts, which reduces a manufacturing cost.

<K. Modification>

Although the embodiments above use a coil spring and a corrugated spring as the elastic element, other types of coils or heat-resistant rubber may be used instead.

While the invention has been described in detail, the foregoing description is in all aspects illustrative and not restrictive. It is understood that numerous other modifications and variations can be devised without departing from the scope of the invention.

We claim:

1. A pressure contact type semiconductor device which comprises a stacked structure which is formed by stacking a first distortion buffer plate and a first electrode plate on a first major surface of a semiconductor body which has at least one PN junction and stacking a second distortion buffer plate and a second electrode plate on a second major surface of said semiconductor body, said semiconductor device being used with said first and said second distortion buffer plates in an alloy-free contact with said semiconductor body and with said first and said second electrode plates pressed against said semiconductor body, said semiconductor device comprising:

first restraint means inserted between said first electrode plate and said first distortion buffer plate, said first restraint means elastically axially biasing said first distortion buffer plate against said first major surface of said semiconductor body and restricting a relative positional relation between said first electrode plate and said first distortion buffer plate in a direction which is parallel with said first major surface of said semiconductor body, wherein, a first recess is formed in said first electrode plate at a portion which faces said semiconductor body, and a first hole which is a through hole having a smaller opening than said first recess is formed in said first distortion buffer plate at a portion which faces said first recess, and said first restraint means comprises,
an elastic member which is contained in said first recess and
a first pin inserted in said first recess to be biased by said elastic member against said first major surface of said semiconductor body, comprising,
a base portion having a larger diameter than the diameter of said first hole, said base portion being contained in said first recess, and
a protrusion contained in said first recess to extend from said base portion, said protrusion being shorter than the thickness of said first distortion buffer plate; and second restraint means inserted between said second electrode plate and said second distortion buffer plate, said second restraint means restricting a relative positional relation between said second electrode plate and said second distortion buffer plate in a direction which is parallel with said second major surface of said semiconductor body.

2. The pressure contact type semiconductor device of claim 1, wherein said first hole is a through hole with a bottom.

3. The pressure contact type semiconductor device of claim 1, wherein said first restraint means is spatially separated into biasing means and restricting means, said biasing means biasing said first distortion buffer plate against said first major surface of said semiconductor body, said restricting means restricting the relative positional relation between said first electrode plate and said first distortion buffer plate in the direction which is parallel with said first major surface of said semiconductor body, and said restricting means includes the first elastic member which is inserted at a border between a periphery of said first electrode plate and a periphery of said first distortion buffer plate.

4. The pressure contact type semiconductor device of claim 3, wherein said restricting means further comprises:

a second elastic element contained in said first recess; and an electrode member extending from said first recess to said through hole, said electrode member contacting said first major surface of said semiconductor body, said electrode member being biased by said second elastic element against said first major surface.

5. The pressure contact type semiconductor device of claim 3, wherein a second recess is formed in said second electrode plate at a portion which faces said semiconductor body, a second hole is formed in said second distortion buffer plate at a portion which faces said second recess, and said second restraint means includes:

a third elastic element contained in said second recess; and an electrode member extending from said second recess to said through hole, said electrode member contacting said second major surface of said semiconductor body, said electrode member being biased by said third elastic element against said second major surface.

6. The pressure contact type semiconductor device of claim 4, wherein a second recess is formed in said second electrode plate at a portion which faces said semiconductor body, a second hole is formed in said second distortion buffer plate at a portion which faces said second recess, and said second restraint means includes a second pin which is contained to extend from said second recess to said second hole.

7. The pressure contact type semiconductor device of claim 4, wherein said second restraint means includes a ring member which is engaged with peripheries of said second electrode plate and said second distortion buffer plate.

8. A pressure contact type semiconductor device which comprises a stacked structure which is formed by stacking a first distortion buffer plate and a first electrode plate on a first major surface of a semiconductor body which has at least one PN junction and stacking a second distortion buffer plate and a second electrode plate on a second major surface of said semiconductor body, said semiconductor device being used with said first and said second distortion buffer plates in an alloy-free contact with said semiconductor body and with said first and said second electrode plates pressed against said semiconductor body, said semiconductor device comprising:

an insulation casing for housing said stacked structure, said casing being linked to said first and said second electrode plates; and restraint means inserted between said first electrode plate and said first distortion buffer plate, said restraint means elastically axially biasing said first distortion buffer plate against said first major surface of said semiconductor body and restricting a relative positional relation between said first electrode plate and said first distortion buffer plate in a direction which is parallel with said first major surface of said semiconductor body, wherein, a recess is formed in said first electrode plate at a portion which faces said semiconductor body, a hole which is a through hole having a smaller opening than said recess is formed in said first distortion buffer plate at a portion which faces said recess, and said restraint means comprising,
  an elastic member contained in said recess, and
  a pin contained in said recess to be biased by said elastic member against said first major surface of said semiconductor body, said pin comprising,
    a base portion having a larger diameter than the diameter of said hole, said base portion being contained in said recess, and
    a protrusion contained in said recess to extend from said base portion, said protrusion being shorter than the thickness of said first distortion buffer plate, and wherein said second electrode plate is engaged with said second distortion buffer plate.

9. The pressure contact type semiconductor device of claim 8, wherein said hole is a through hole with a bottom.

10. The pressure contact type semiconductor device of claim 8, wherein said restraint means is spatially separated into biasing means and restricting means, said biasing means biasing said first distortion buffer plate against said first major surface of said semiconductor body, said restricting means restricting the relative positional relation between said first electrode plate and said first distortion buffer plate in the direction which is parallel with said first major surface of said semiconductor body, and said restricting means includes the elastic member which is inserted at a border between a periphery of said first electrode plate and a periphery of said first distortion buffer plate.

11. The pressure contact type semiconductor device of claim 10, wherein said restricting means includes:
  a second elastic element contained in said recess; and
  an electrode member extending from said recess to said through hole, said electrode member contacting said first major surface of said semiconductor body, said electrode member being biased by said second elastic element against said first major surface.

* * * * *